(12) United States Patent
Nakamura

(10) Patent No.: US 9,865,657 B2
(45) Date of Patent: Jan. 9, 2018

(54) SOLID-STATE IMAGING DEVICE AND ELECTRONIC APPARATUS

(71) Applicant: Sony Corporation, Tokyo (JP)

(72) Inventor: Akihiro Nakamura, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 14/382,580

(22) PCT Filed: Feb. 27, 2013

(86) PCT No.: PCT/JP2013/055112
§ 371 (c)(1),
(2) Date: Sep. 3, 2014

(87) PCT Pub. No.: WO2013/136981
PCT Pub. Date: Sep. 19, 2013

(65) Prior Publication Data
US 2015/0021578 A1    Jan. 22, 2015

(30) Foreign Application Priority Data

Mar. 15, 2012 (JP) .................................. 2012-058749

(51) Int. Cl.
*H01L 27/30* (2006.01)
*H04N 5/369* (2011.01)
(Continued)

(52) U.S. Cl.
CPC ........ *H01L 27/307* (2013.01); *H01L 27/1461* (2013.01); *H01L 27/1464* (2013.01);
(Continued)

(58) Field of Classification Search
CPC .......... H04N 5/369; H04N 9/07; H04N 5/361; H01L 27/1461; H01L 27/14667;
(Continued)

(56) References Cited

U.S. PATENT DOCUMENTS

2003/0189656 A1* 10/2003 Shinohara ......... H01L 27/14645
348/272
2012/0037960 A1*  2/2012 Yokoyama ........ H01L 27/14623
257/230

FOREIGN PATENT DOCUMENTS

JP          H0752927    *   6/1995
JP          2003-298038     10/2003
(Continued)

OTHER PUBLICATIONS

English Abstract of JP-H0752927.*

*Primary Examiner* — Hrayr A Sayadian
(74) *Attorney, Agent, or Firm* — Chip Law Group

(57) ABSTRACT

A solid-state imaging device includes: a plurality of laminated photoelectric conversion sections; a reading section configured of a semiconductor region formed inside a semiconductor substrate and reading electric charge that has been subjected to photoelectric conversion in the photoelectric conversion sections; a charge accumulation section accumulating the electric charge read by the reading section; and a light shielding structure shielding, from light, a portion other than the reading section and the photoelectric conversion sections.

12 Claims, 10 Drawing Sheets

(51) Int. Cl.
　　　*H01L 27/146* 　　(2006.01)
　　　*H04N 9/07* 　　　(2006.01)
　　　*H04N 5/361* 　　 (2011.01)

(52) U.S. Cl.
　　　CPC .. *H01L 27/14623* (2013.01); *H01L 27/14641* (2013.01); *H01L 27/14645* (2013.01); *H01L 27/14647* (2013.01); *H01L 27/14667* (2013.01); *H04N 5/361* (2013.01); *H04N 5/369* (2013.01); *H04N 9/07* (2013.01)

(58) Field of Classification Search
　　　CPC ........... H01L 27/14641; H01L 27/1464; H01L 27/14647; H01L 27/307; H01L 27/14645; H01L 27/14623
　　　USPC .......................................................... 257/40
　　　See application file for complete search history.

(56) References Cited

FOREIGN PATENT DOCUMENTS

| | | |
|---|---|---|
| JP | 2003-332551 | 11/2003 |
| JP | 2008-500724 | 1/2008 |

\* cited by examiner

[ FIG. 1 ]
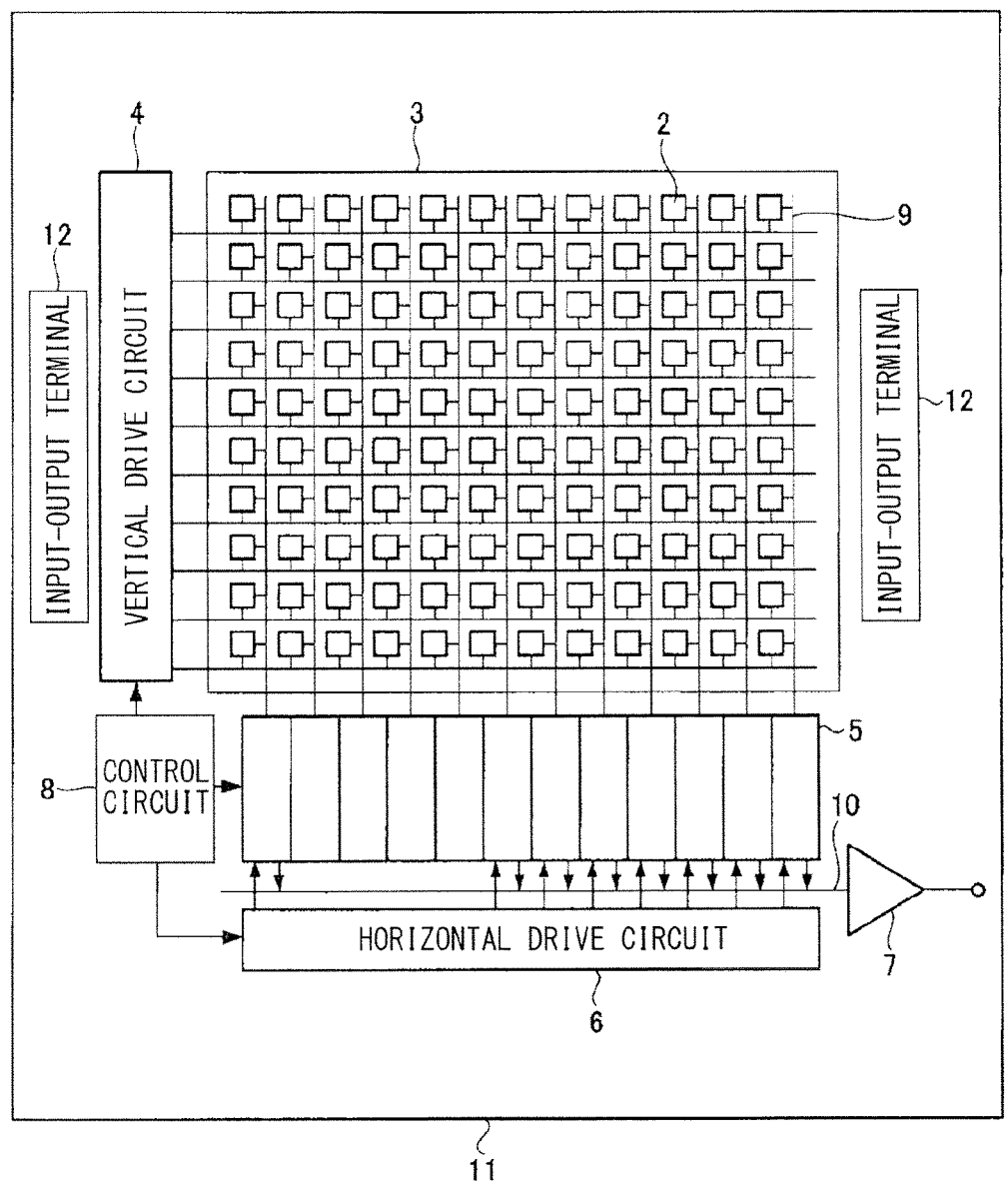

[ FIG. 2 ]
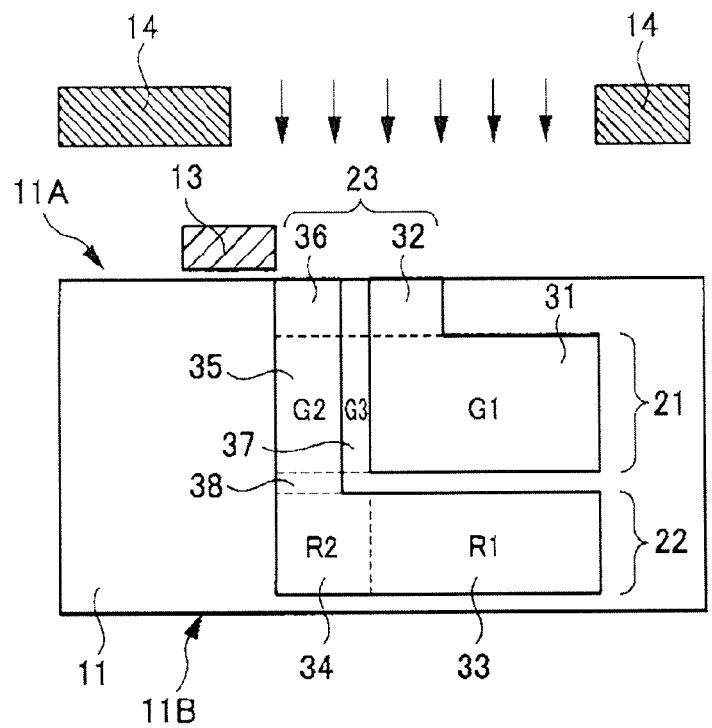
[ FIG. 3 ]
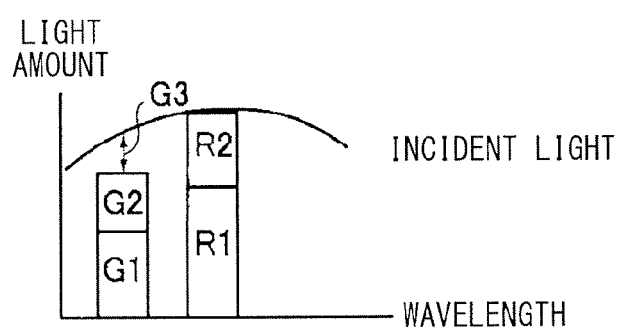

[ FIG. 4A ]
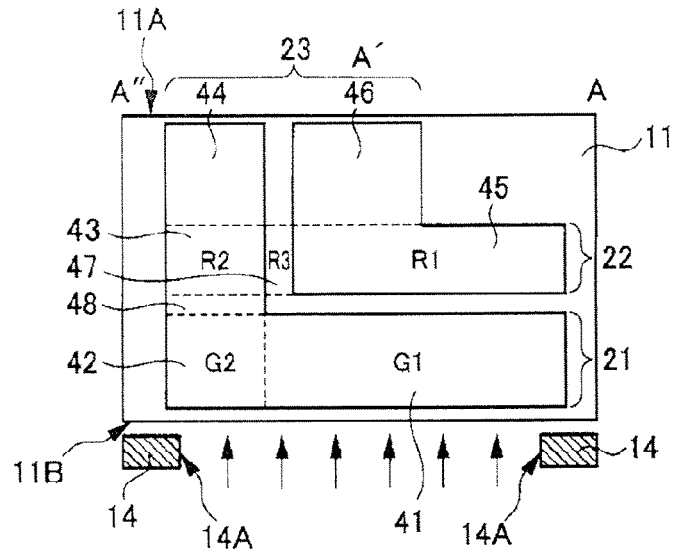
[ FIG. 4B ]
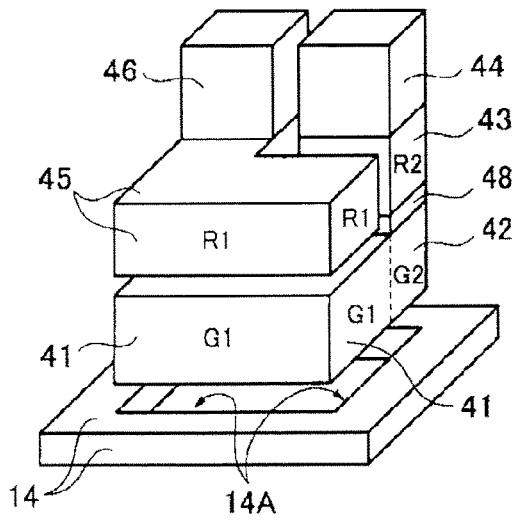
[ FIG. 4C ]
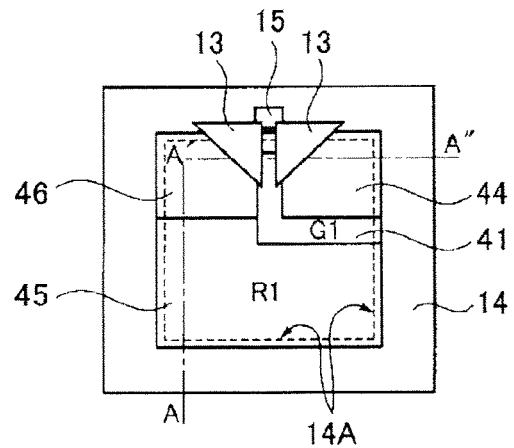

[ FIG. 5 ]
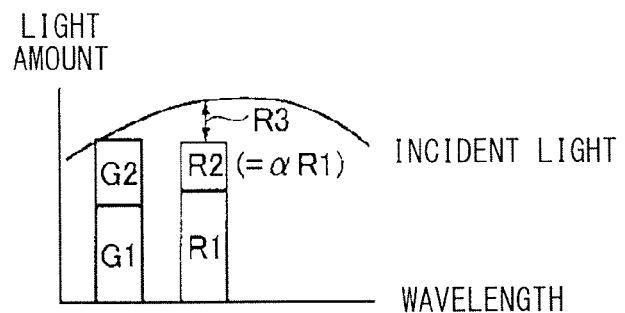
[ FIG. 6 ]
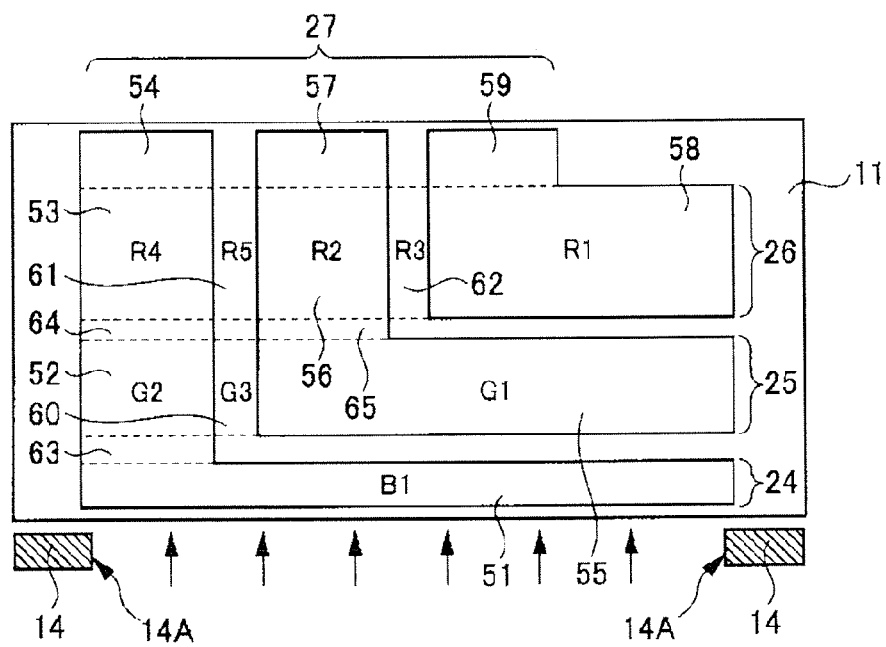

[ FIG. 7A ]
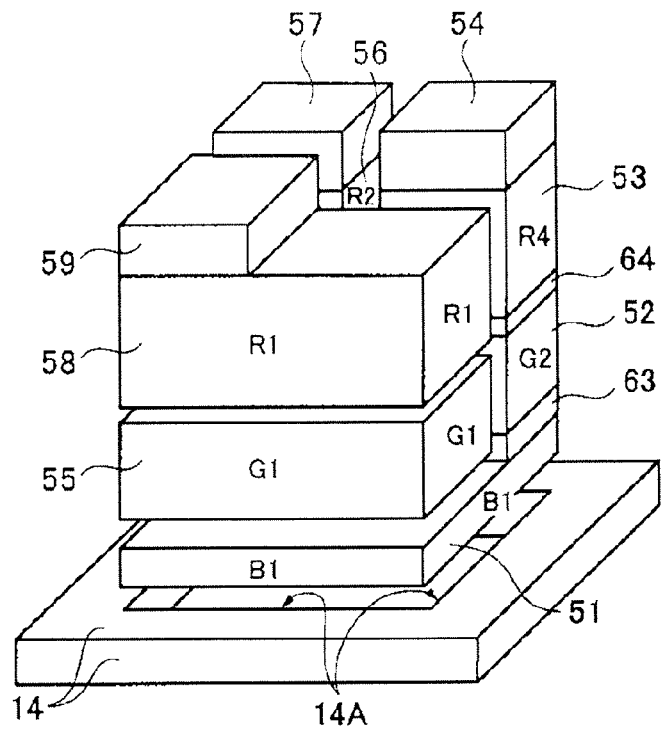
[ FIG. 7B ]
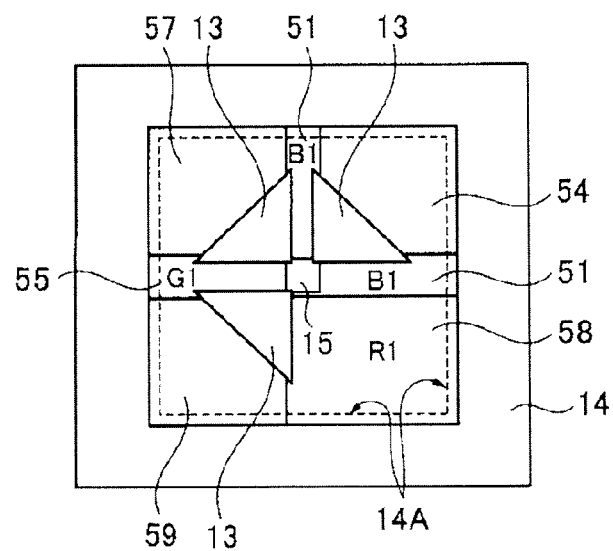

[ FIG. 8 ]
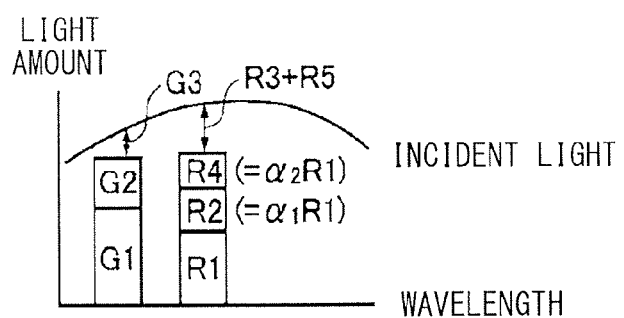

[ FIG. 9A ]
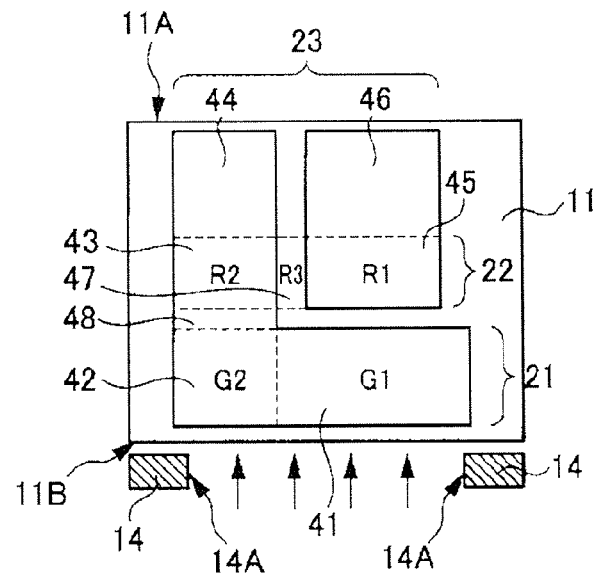
[ FIG. 9B ]
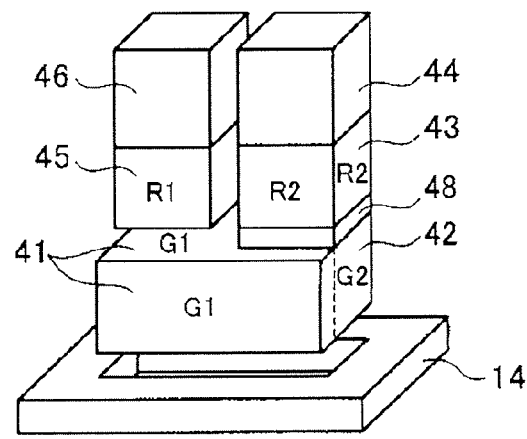
[ FIG. 9C ]
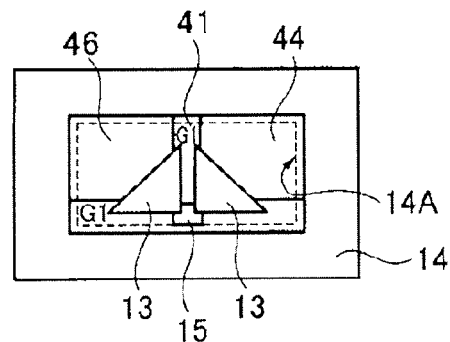

[ FIG. 10A ]
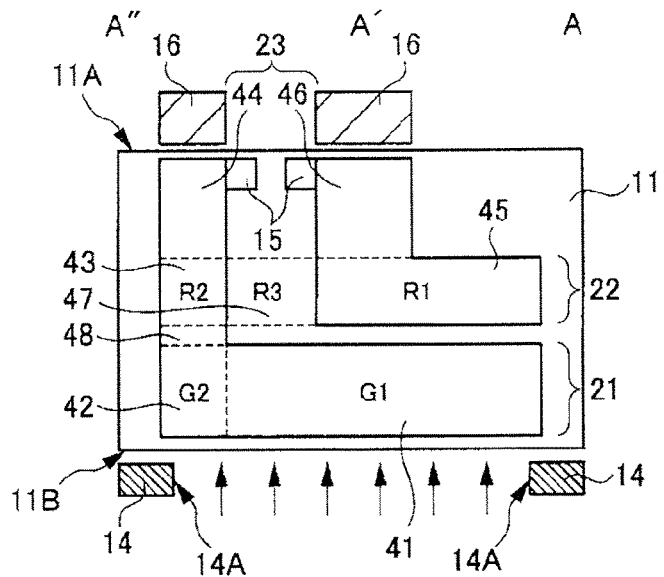
[ FIG. 10B ]
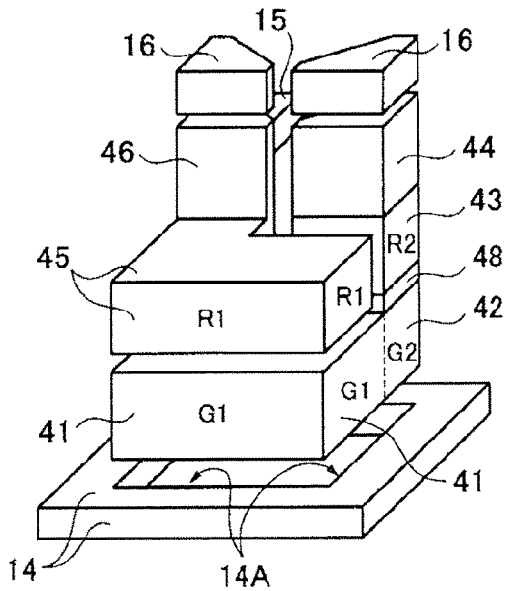
[ FIG. 10C ]
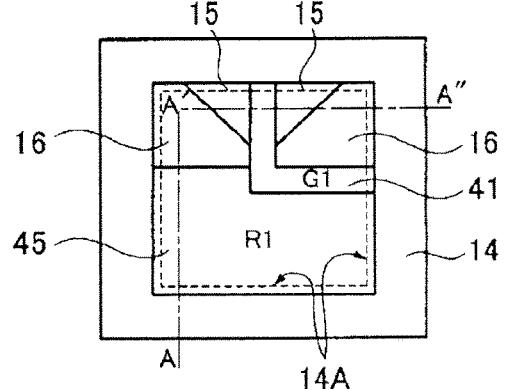

[ FIG. 11 ]
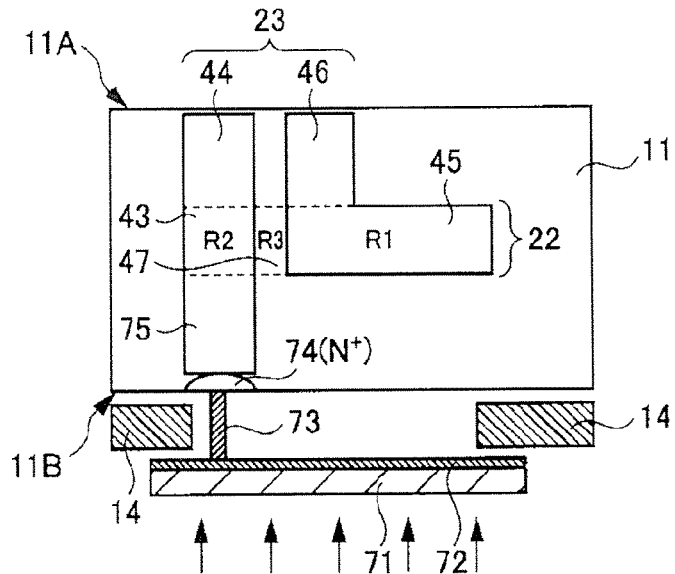
[ FIG. 12 ]
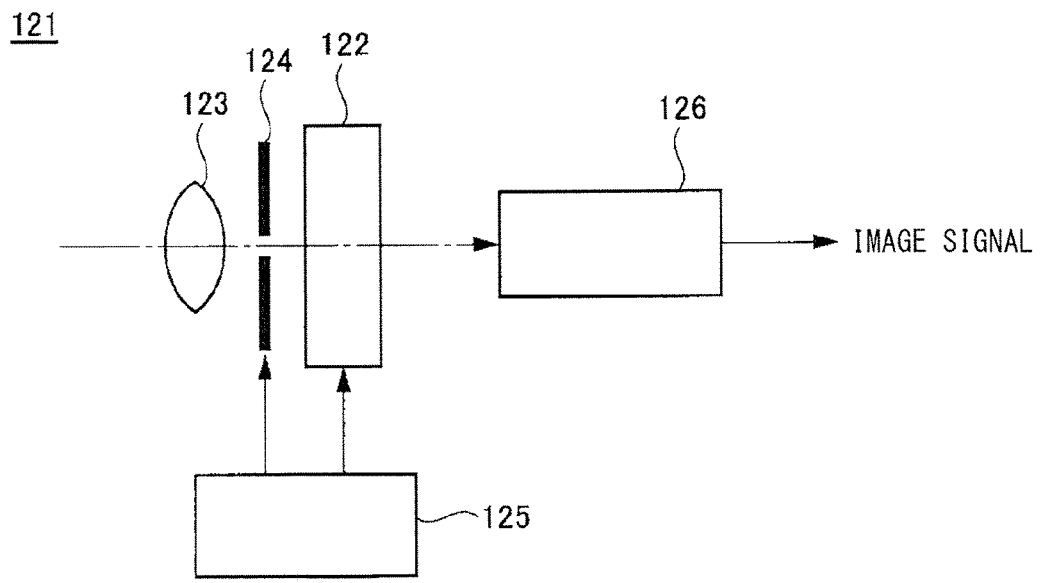

[ FIG. 13A ]
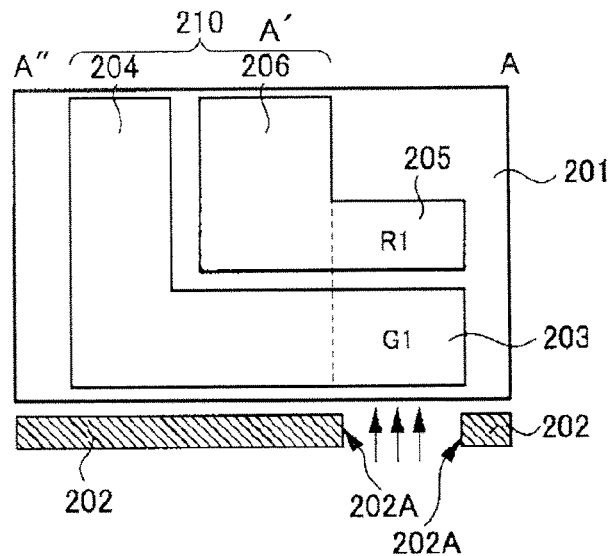
[ FIG. 13B ]
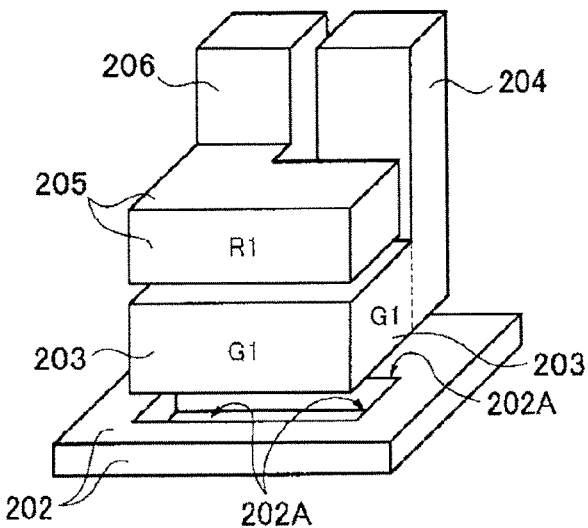
[ FIG. 13C ]
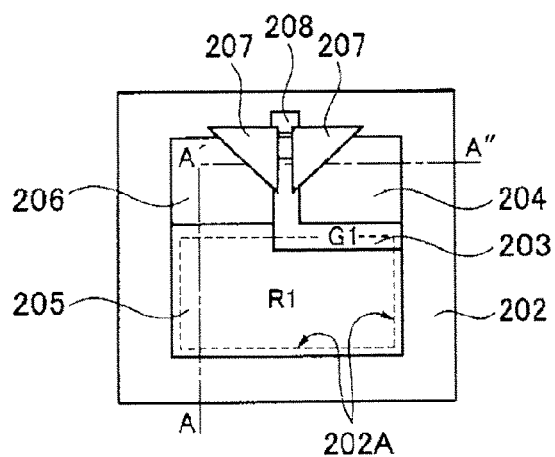

SOLID-STATE IMAGING DEVICE AND ELECTRONIC APPARATUS

TECHNICAL FIELD

The present technology relates to a solid-state imaging device that has a configuration in which a plurality of photoelectric conversion sections are laminated in the same pixel, and relates to an electronic apparatus that includes this solid-state imaging device.

BACKGROUND ART

For a solid-state imaging device, there has been proposed a configuration in which a plurality of photodiodes (photoelectric conversion sections) are laminated in the same pixel in order to improve efficiency in utilizing light to achieve high sensitivity and high resolution (for example, see Patent Literature 1).

In the solid-state imaging device in which the plurality of photodiodes are laminated in the same pixel, the photodiodes are laminated at different depths in a silicon in order to perform color separation by utilizing a difference in wavelength of absorbed light between the depths in the silicon.

Further, in the configuration disclosed in Patent Literature 1, in order to read electric charge from each of the photodiodes formed inside the silicon, a reading section configured of an N$^+$ region is provided to read electric charge from the photodiodes to a surface of the silicon.

Moreover, there is provided a structure in which a light shielding film covers above the reading section so that the reading section is shielded from light.

CITATION LIST

Patent Literature

Patent Literature 1: Japanese Unexamined Patent Application Publication (Translation of PCT Application) No. 2008-500724

SUMMARY OF THE INVENTION

However, in the configuration disclosed in Patent Literature 1, it is difficult to reduce an area of the reading section since the N$^+$ region is used for the reading section. As a result, it becomes necessary to secure the reading section with an area of a certain degree or more, and therefore, efficiency in area utilization decreases.

Moreover, it is necessary to secure the area of the reading section other than photodiode sections, and therefore, it is difficult to reduce a size of pixel.

Moreover, in the configuration disclosed in Patent Literature 1, the light shielding film covers above the reading section. Therefore, an opening width of the pixel is reduced due to the light shielding film, and accordingly, sensitivity is degraded.

Accordingly, it is desirable to provide a solid-state imaging device that has a configuration in which a plurality of photoelectric conversion sections are laminated and has favorable efficiency in area utilization. It is also desirable to provide an electronic apparatus that includes such a solid-state imaging device.

A solid-state imaging device according to an embodiment of the present technology includes: a plurality of laminated photoelectric conversion sections; a reading section configured of a semiconductor region formed inside a semiconductor substrate and reading electric charge that has been subjected to photoelectric conversion in the photoelectric conversion sections; and a charge accumulation section accumulating the electric charge read by the reading section. Further, the solid-state imaging device includes a light shielding structure shielding, from light, a portion other than the reading section and the photoelectric conversion sections.

An electronic apparatus according to an embodiment of the present technology includes: an optical system; a solid-state imaging device; and a signal processing circuit processing an output signal from the solid-state imaging device, and the solid-state imaging device has the above-described configuration of the solid-state imaging device of the present technology.

In the solid-state imaging device of the embodiment of the present technology, the light shielding structure shields, from light, the portion other than the reading section and the photoelectric conversion sections. Therefore, it is possible to allow light to enter the reading section and to allow photoelectric conversion to be performed in the semiconductor region of the reading section.

Accordingly, it is possible to enlarge the opening in the light shielding structure to increase an area of a region in which photoelectric conversion is allowed to be performed.

In the configuration of the electronic apparatus of the embodiment of the present technology, the solid-state imaging device of the embodiment of the present technology is included. Therefore, it is possible to increase the area of the region in which photoelectric conversion is allowed to be performed, in the solid-state imaging device.

According to the solid-state imaging device and the electronic apparatus of the embodiments of the present technology, it is possible to increase the area of the region in which photoelectric conversion is allowed to be performed. Therefore, it is possible to improve efficiency in pixel area utilization, and to improve saturated signal amount Qs, sensitivity, etc.

Since it is possible to improve the efficiency in pixel area utilization, a signal amount increases, and influence of noise becomes relatively small. Therefore, it is possible to improve S/N ratio.

Moreover, in the structure in which the photoelectric conversion sections are laminated, it is possible to allow photoelectric conversion to be performed in the semiconductor region of the reading section. Therefore, it is possible to secure the reading section with a sufficient area even when the pixel size is reduced. Accordingly, it is possible to reduce the pixel size to achieve larger number of pixels, a smaller size, etc. of the solid-state imaging device.

BRIEF DESCRIPTION OF THE DRAWINGS

FIG. 1 is a schematic configuration diagram (a circuit configuration diagram) of a solid-state imaging device of a first embodiment.

FIG. 2 is a cross-sectional view of main part of the solid-state imaging device of the first embodiment.

FIG. 3 is a diagram for explaining a method of processing a read signal in the solid-state imaging device of the first embodiment.

FIG. 4A is a schematic configuration diagram of a solid-state imaging device of a second embodiment.

FIG. 4B is a schematic configuration diagram of the solid-state imaging device of the second embodiment.

FIG. 4C is a schematic configuration diagram of the solid-state imaging device of the second embodiment.

FIG. 5 is a diagram for explaining a method of processing a read signal in the solid-state imaging device of the second embodiment.

FIG. 6 is a schematic configuration diagram (a cross-sectional view of main part) of a solid-state imaging device of a third embodiment.

FIG. 7A is a schematic configuration diagram of the solid-state imaging device of the third embodiment.

FIG. 7B is a schematic configuration diagram of the solid-state imaging device of the third embodiment.

FIG. 8 is a diagram for explaining a method of processing a read signal in the solid-state imaging device of the third embodiment.

FIG. 9A is a schematic configuration diagram of a solid-state imaging device of a fourth embodiment.

FIG. 9B is a schematic configuration diagram of the solid-state imaging device of the fourth embodiment.

FIG. 9C is a schematic configuration diagram of the solid-state imaging device of the fourth embodiment.

FIG. 10A is a schematic configuration diagram of a solid-state imaging device of a fifth embodiment.

FIG. 10B is a schematic configuration diagram of the solid-state imaging device of the fifth embodiment.

FIG. 10C is a schematic configuration diagram of the solid-state imaging device of the fifth embodiment.

FIG. 11 is a schematic configuration diagram (a cross-sectional view of main part) of a solid-state imaging device of a sixth embodiment.

FIG. 12 is a schematic configuration diagram (a block diagram) of an electronic apparatus of a seventh embodiment.

FIG. 13A is a schematic configuration diagram of a solid-state imaging device of a comparative example.

FIG. 13B is a schematic configuration diagram of the solid-state imaging device of the comparative example.

FIG. 13C is a schematic configuration diagram of the solid-state imaging device of the comparative example.

MODES FOR CARRYING OUT THE INVENTION

A best embodiment (hereinafter, referred to as "embodiment") for carrying out the present technology will be described below.

It is to be noted that the description will be provided in the following order.
1. First Embodiment (Solid-state Imaging Device)
2. Second Embodiment (Solid-state Imaging Device)
3. Third Embodiment (Solid-state Imaging Device)
4. Fourth Embodiment (Solid-state Imaging Device)
5. Fifth Embodiment (Solid-state Imaging Device)
6. Sixth Embodiment (Solid-state Imaging Device)
7. Seventh Embodiment (Electronic Apparatus)

1. First Embodiment

FIG. 1 shows a schematic configuration diagram (a circuit configuration diagram) of a solid-state imaging device of a first embodiment.

Also, FIG. 2 shows a cross-sectional view of main part of the solid-state imaging device shown in FIG. 1.

As shown in FIG. 1, a solid-state imaging device 1 according to the present embodiment is configured to be formed of a pixel section (a so-called imaging region) 3 and a peripheral circuit section that includes a drive circuit, etc.

In the pixel section 3, a number of pixels 2 each including photoelectric conversion sections are arranged regularly and two-dimensionally on a semiconductor substrate 11, for example, a silicon substrate.

The pixel 2 includes the photoelectric conversion sections and a pixel transistor configured of a MOS transistor.

As the pixel transistor, for example, one or more of a transfer transistor, a reset transistor, an amplifier transistor, and a selection transistor are included.

The peripheral circuit section is configured to include a vertical drive circuit 4, a column signal processing circuit 5, a horizontal drive circuit 6, an output circuit 7, a control circuit 8, etc.

The vertical drive circuit 4 may be configured, for example, of a shift resistor. The vertical drive circuit 4 selects a pixel drive line, supplies a pulse for driving a pixel to the selected pixel drive line, and drives pixels on a row unit basis. Specifically, the vertical drive circuit 4 selectively scans the pixels 2 in the pixel section 3 on a row unit basis in a sequential manner in a vertical direction, and supplies, to the column signal processing circuit 5 via a vertical signal line 9, a pixel signal based on signal electric charge generated in accordance with an amount of received light in a photoelectric conversion element (for example, a photodiode) in each of the pixels 2.

The column signal processing circuit 5 may be disposed, for example, for each column of the pixels 2. The column signal processing circuit 5 performs, for each pixel column, a signal process such as a noise removing process on the signal outputted from the pixels in one row. Specifically, the column processing circuit 5 performs signal processes such as CDS for removing a fixed pattern noise unique to the pixels 2, signal amplification, and AD conversion. At an output stage of the column signal processing circuit 5, a horizontal selection switch (not illustrated) is connected between the column signal processing circuit 5 and a horizontal signal line 10.

The output circuit 7 performs a signal process on signals sequentially supplied from the respective column signal processing circuits 5 via the horizontal signal line 10, and outputs the processed signal.

Input-output terminals 12 supply signals to and receive signals from outside.

FIG. 2 shows a cross-sectional view of the pixel 2 in the solid-state imaging device 1 shown in FIG. 1.

The solid-state imaging device of the present embodiment has a so-called front-surface illumination type structure in which light enters from the same side as the circuits and the lines of the semiconductor substrate provided with a light reception section.

As shown in FIG. 2, in the present embodiment, two photoelectric conversion sections 21 and 22 are formed that are laminated in a depth direction of the semiconductor substrate 11.

Each of the photoelectric conversion sections 21 and 22 is configured of an impurity region formed inside the semiconductor substrate 11.

Moreover, on a surface 11A side (on a top surface side, in FIG. 2) of the semiconductor substrate 11, a light receiving surface where light enters is formed, a transfer gate 13 is provided, and further, unillustrated circuits (such as a reading circuit and circuits in the peripheral circuit section) are formed.

A light shielding structure 14 is provided above the semiconductor substrate 11, so as to cover semiconductor regions around the semiconductor regions of the photoelectric conversion sections 21 and 22.

The light shielding structure 14 may be configured of an existing publicly-known light shielding material.

As a configuration of the light shielding structure 14, for example, a metal layer, a layer containing black pigment, an anti-reflection film, a wiring layer also serving as a light shielding layer, a trench separation structure, etc. may be mentioned.

Moreover, although it is not illustrated, a micro lens that condenses incident light may be provided above (on the light incident side of) the light shielding structure 14 as necessary.

The semiconductor substrate 11 may be configured of: a semiconductor substrate such as a silicon substrate; a semiconductor substrate such as a silicon substrate and a semiconductor epitaxial layer formed thereon; a plurality of laminated semiconductor layers; etc.

The first photoelectric conversion section 21 on the front surface 11A side of the semiconductor substrate 11 out of the two photoelectric conversion sections 21 and 22 performs photoelectric conversion on light of green G that has a short wavelength. The second photoelectric conversion section 22 on a back surface 11B side of the semiconductor substrate 11 performs photoelectric conversion on light of red R that has a long wavelength.

In the present embodiment, in particular, the first photoelectric conversion section 21 is configured of a semiconductor region 31(G1), a semiconductor region 35(G2), and a semiconductor region 37(G3), and the second photoelectric conversion section 22 is configured of a semiconductor region 33(R1) and a semiconductor region 34(R2).

A semiconductor region 32 configuring a reading section 23 is formed continuously on the semiconductor region 31(G1).

The semiconductor region 33(R1) and the semiconductor region 34(R2) are continuously and integrally formed at the same depth in the semiconductor substrate 11.

A semiconductor region 38, the semiconductor region 35(G2), and a semiconductor region 36 are formed, in order from a lower layer, continuously on the semiconductor region 34. It is to be noted that these semiconductor region 38, semiconductor region 35(G2), and semiconductor region 36 are integrally-formed semiconductor regions that are sectioned based on depth and have the same impurity concentration.

Moreover, these semiconductor region 38, semiconductor region 35(G2), and semiconductor region 36 configure the reading section 23 that reads electric charge that has been subjected to photoelectric conversion in the second photoelectric conversion section 22 (33 and 34).

Specifically, the semiconductor region 35(G2) serves as the reading section 23 for the second photoelectric conversion section 22, and also serves as the first photoelectric conversion section 21.

The semiconductor region 37(G3) is a separation region between the semiconductor region 31(G1) and the semiconductor region 35(G2). Electric charge that has been subjected to photoelectric conversion in this separation region is not read from the reading section 23. Therefore, this separation region functions as a no-effect region.

The semiconductor region 31(G1) of the first photoelectric conversion section 21, and the semiconductor regions 33(R1) and 34(R2) of the second photoelectric conversion section 22 are formed as N-type semiconductor regions in a P-type semiconductor region of the semiconductor substrate 11.

The semiconductor region 32, and the semiconductor region 38—the semiconductor region 35(G2)—the semiconductor region 36 are also formed as N-type semiconductor regions in the P-type semiconductor region of the semiconductor substrate 11. These semiconductor regions 32, 38, 35, and 36 are set to have impurity concentration that allows the semiconductor regions 32, 38, 35, and 36 to be depleted by a voltage for setting a pixel. Accordingly, photoelectric conversion, reading of electric charge, etc. are allowed to be performed in these semiconductor regions 32, 38, 35, and 36.

The semiconductor region 37(G3) that is the separation region is a P-type semiconductor region.

The semiconductor region 31(G1) of the first photoelectric conversion section 21 and the semiconductor region 32 formed continuously thereon and configuring the reading section 23 may have the same impurity concentration or may have different impurity concentrations. In a case where the semiconductor region 31(G1) and the semiconductor region 32 have different impurity concentrations, the impurity concentrations are each set to allow the semiconductor region 31(G1) and the semiconductor region 32 to be both depleted by the voltage for setting a pixel.

The semiconductor region 33(R1) and the semiconductor region 34(R2) of the second photoelectric conversion section 22 and the semiconductor region 38—the semiconductor region 35(G2)—the semiconductor region 36 that are formed continuously thereon may have the same impurity concentration or may have different impurity concentrations. In a case where the semiconductor regions 33(R1) and 34(R2) and the semiconductor regions 38, 35(G2), and 36 have different impurity concentrations, the impurity concentrations are each set to allow all of the semiconductor regions 33(R1), 34(R2), 38, 35(G2), and 36 to be depleted by the voltage for setting a pixel.

The transfer gate 13 shown in FIG. 2 transfers electric charge from the second photoelectric conversion section 22 read from the semiconductor region 36 on the left in the reading section 23 to a first floating diffusion formed at an unillustrated position in the semiconductor substrate 11.

It is to be noted that electric charge from the semiconductor region 31(G1) of the first photoelectric conversion section 21 read from the semiconductor region 32 on the right in the reading section 23 is transferred by an unillustrated transfer gate to another second floating diffusion formed at an unillustrated position in the semiconductor substrate 11.

The first floating diffusion and the second floating diffusion serve as charge accumulation sections that accumulate electric charges read from the photoelectric conversion sections 21 and 22.

The semiconductor region 31(G1) of the first photoelectric conversion section 21, the semiconductor region 32 of the reading section 23, an unillustrated transfer gate, the unillustrated floating diffusion, and transistors (such as an amplifier transistor, a selection transistor, and a reset transistor) configure one pixel 2 shown in the circuit configuration diagram in FIG. 1.

Similarly, the respective regions from the semiconductor region 33(R1) of the second photoelectric conversion section 22 to the semiconductor region 36 of the reading section 23, the transfer gate 13, the unillustrated floating diffusion, and transistors (such as an amplifier transistor, a selection transistor, and a reset transistor) configure one pixel 2.

Moreover, the first photoelectric conversion section 21 and the second photoelectric conversion section 22 are laminated in a top-bottom direction. Therefore, a vertically-laminated pixel structure is achieved in which two pixels 2 are laminated in the top-bottom direction (the vertical direction).

The light shielding structure 14 is configured to shield, from light, portions other than the reading section 23 and the photoelectric conversion sections 21 and 22. A portion, of the light shielding structure 14, corresponding to the reading section 23 is open.

Next, description will be provided of a method of processing a signal that is obtained based on the electric charge read by the reading section 23 in the solid-state imaging device of the present embodiment.

As shown in FIG. 3, first, a relationship between light amounts of G1 and G2 is determined in advance for light entering a depth region in the first photoelectric conversion section 21 as spectroscopic characteristics. For example, the relationship between the light amounts of G1 and G2 is determined for light having a wavelength of green G.

Specifically, a relationship represented by the following Expression (1) is determined.

$$G2 = \alpha G1 \quad (1)$$

Concerning the semiconductor region 37(G3) that is a no-effect region, a relationship between light amounts of G1 and G3 is determined based on an area ratio between the semiconductor region 31(G1) and the semiconductor region 37(G3). Alternatively, the relationship between the light amounts of G1 and G3 is determined based on a difference between the amount of incident light of green G and the light amount of G1+G2 shown in FIG. 3 as a light reception amount of the semiconductor region 37(G3).

Specifically, a relationship represented by the following Expression (2) is determined.

$$G3 = \beta G1 \quad (2)$$

A purpose of determining this G3 is to determine a photoelectric conversion amount in the no-effect region and to thereby allow the areas (the cross-sectional areas in the horizontal direction) of the first photoelectric conversion section 21 and the second photoelectric conversion section 22 to be equivalent. By allowing these areas to be equivalent, a difference in signal caused by the areas of the respective photoelectric conversion sections 21 and 22 is eliminated, and sensitivity becomes uniform.

It is to be noted that $\alpha$ and $\beta$ mentioned above are light amounts depending on area of photoelectric conversion, and are considered to be constant values. However, $\alpha$ and $\beta$ may be functions that vary depending on light amounts as $\alpha$ (light amount) and $\beta$ (light amount).

Moreover, the values of $\alpha$ and $\beta$ may be the same value in all of the pixels 2 in the pixel section 3, or may be different values between the pixels 2 depending on positions thereof in the pixel section 3.

The values of $\alpha$ and $\beta$ may be the same value in all of the pixels 2 in the pixel section 3 if any particular problem is not caused thereby.

On the other hand, for example, when an influence is caused on the pixels 2 in the peripheral portion of the pixel section 3 based on a difference in distribution of incident angle of obliquely-entering light, the values of $\alpha$ and $\beta$ may be different values between a central portion and the peripheral portion in the pixel section 3, or may vary in a step-wise manner from the central portion to the peripheral portion. It is to be noted that, when the influence is allowed to be reduced by a publicly-known method, for example, by shifting the position of the photoelectric conversion section in the pixel 2 in the peripheral portion in the pixel section 3, the values of $\alpha$ and $\beta$ may also be the same value by such a method.

A first signal obtained based on electric charge read from the semiconductor region 36 on the left in the reading section 23 is R1+R2+G2.

A second signal obtained based on electric charge read from the semiconductor region 32 on the right in the reading section 23 is only G1.

Further, finally, based on the first signal and the second signal, a signal of only read R is obtained as R=R1+R2= (R1+R2+G2)−G2=(R1+R2+G2)−αG1=first signal− α·second signal.

Also, based on the second signal, a signal of only green G is obtained as G=G1+G2+G3=G1(1+α+β)=second signal· (1+α+β).

The solid-state imaging device of the present embodiment is allowed to be manufactured by an existing publicly-known method.

The semiconductor regions having L-shaped cross-sections configured of the semiconductor regions 31 and 32 and of the semiconductor regions 33, 34, 38, 35, and 36 may be formed, for example, by performing ion injection from the front surface side of the semiconductor substrate and ion injection from the back surface side of the semiconductor substrate in combination.

Also, a semiconductor region extending longer in a height direction may be formed by repeatedly performing epitaxial growth of a semiconductor layer and ion injection to the epitaxial layer as disclosed in Patent Literature 1.

According to the configuration of the solid-state imaging device of the present embodiment described above, the light shielding structure 14 shields, from light, the portions other than the photoelectric conversion sections 21 and 22 and the reading section 23. Further, the light shielding structure 14 has an opening at a portion thereof corresponding to the reading section 23.

Therefore, it is possible to allow light to enter the reading section 23 and to allow photoelectric conversion to be performed in the semiconductor region of the reading section 23.

Accordingly, it is possible to enlarge the opening of the light shielding structure 14 to increase the area of the region in which photoelectric conversion is allowed to be performed. Therefore, it is possible to improve efficiency in pixel area utilization, and as a result, it is possible to improve saturated signal amount Qs, sensitivity, etc.

Moreover, it is possible to improve efficiency in pixel area utilization. Therefore, signal amount is increased and influence of noise becomes relatively small. Therefore, it is possible to improve S/N ratio.

Moreover, according to the configuration of the solid-state imaging device of the present embodiment, the semiconductor region 35(G2) serves as the reading section 23 for the second photoelectric conversion section 22 and also serves as the first photoelectric conversion section 21, and the electric charge that has been subjected to photoelectric conversion in the semiconductor region 35(G2) is allowed to be read.

Thus, it is possible to allow photoelectric conversion to be performed in the semiconductor region 35 configuring the reading section 23. Therefore, it is possible to dispose the reading section 23 above the second photoelectric conversion section 22 and to secure the reading section 23 with a sufficient area.

Accordingly, in the configuration where two layers of the photoelectric conversion sections 21 and 22 are laminated, it is possible to reduce the pixel size and to thereby achieve larger number of pixels, smaller size, etc. in the solid-state imaging device.

Moreover, according to the method of processing a signal of the present embodiment described above, the light amount of the semiconductor region 37(G3) that is the separation region is also used for calculation. Therefore, it is possible to allow the first photoelectric conversion section 21 and the second photoelectric conversion section 22 to have the same area (the cross-sectional area in the horizontal direction).

Accordingly, a signal difference resulting from the difference in area between the two layers of the photoelectric conversion sections 21 and 22 is eliminated. Therefore, sensitivity in the two layers of the photoelectric conversion sections 21 and 22 is allowed to be uniform and the signal amounts are allowed to be the same. Accordingly, it is possible to simplify calculation.

It is to be noted that color mixture may be caused as a result of photoelectric conversion performed in a region between the semiconductor region 33(R1) of the second photoelectric conversion section 22 and the semiconductor region 31(G1) of the first photoelectric conversion section 21, i.e., at a depth other than those of the photoelectric conversion sections 21 and 22. This color mixture is of about the same degree as that in the existing vertically-laminated pixel structure, and the color mixture does not increase by adopting the configuration of the present embodiment.

2. Second Embodiment (Solid-State Imaging Device)

FIGS. 4A to 4C each show a schematic configuration diagram of a solid-state imaging device of a second embodiment.

FIG. 4A shows a cross-sectional view. FIG. 4B shows a perspective view. FIG. 4C shows a planar view (a top view).

Further, FIG. 4A shows a cross-sectional view taken along a dashed line A-A'-A" in FIG. 4C.

The solid-state imaging device of the present embodiment has a so-called back-surface illumination type structure in which light enters from an opposite side from the circuit formation surface and the lines of the semiconductor substrate provided with a light reception section.

Moreover, on the back surface 11B side (on a bottom surface side, in FIG. 4A) of the semiconductor substrate 11, a light receiving surface where light enters is formed.

Moreover, on the front surface 11A side (on a top surface side, in FIG. 4A) of the semiconductor substrate 11, although not illustrated, a transfer gate similar to the transfer gate 13 in FIG. 2 is provided, and further, unillustrated circuits (such as a reading circuit and circuits in the peripheral circuit section) are formed.

Since the back-surface illumination type structure is adopted in the present embodiment, as shown in FIGS. 4A to 4C, a top-bottom relationship of the two photoelectric conversion sections 21 and 22 that are laminated in the depth direction of the semiconductor substrate 11 is the opposite of that in the first embodiment having the front-surface illumination type structure.

Specifically, the first photoelectric conversion section 21 on the back surface 11B side of the semiconductor substrate 11 out of the two photoelectric conversion sections 21 and 22 performs photoelectric conversion on light of green G that has a short wavelength. The second photoelectric conversion section 22 on the front surface 11A side of the semiconductor substrate 11 performs photoelectric conversion on light of red R that has a long wavelength.

The light shielding structure 14 is provided below the semiconductor substrate 11 so as to cover an end edge portion of the semiconductor regions of the photoelectric conversion sections 21 and 22 and the semiconductor regions therearound. An opening 14A of the light shielding structure 14 is located at a planar position that is in the inner side of end edges of the semiconductor regions of the photoelectric conversion sections.

The light shielding structure 14 may be configured of an existing publicly-known light shielding material.

As a configuration of the light shielding structure 14, for example, a metal layer, a layer containing black pigment, an anti-reflection film, a wiring layer also serving as a light shielding layer, a trench separation structure, etc. may be mentioned.

Moreover, although it is not illustrated, a micro lens that condenses incident light may be provided below (on the light incident side of) the light shielding structure 14 as necessary.

In the present embodiment, in particular, the first photoelectric conversion section 21 is configured of a semiconductor region 41(G1) and a semiconductor region 42(G2), and the second photoelectric conversion section 22 is configured of a semiconductor region 45(R1), a semiconductor region 43(R2), and a semiconductor region 47(R3).

The semiconductor region 41(G1) and the semiconductor region 42(G2) are continuously and integrally formed at the same depth in the semiconductor substrate 11.

A semiconductor region 48, the semiconductor region 43(R2), and a semiconductor region 44 are formed, in order from a lower layer, continuously on the semiconductor region 42(G2). It is to be noted that these semiconductor region 48, semiconductor region 43(R2), and semiconductor region 44 are integrally-formed semiconductor regions that are sectioned based on depth and have the same impurity concentration.

Moreover, these semiconductor region 48, semiconductor region 43(R2), and semiconductor region 44 configure the reading section 23 that reads electric charge that has been subjected to photoelectric conversion in the first photoelectric conversion section 21 (41 and 42).

Specifically, the semiconductor region 43(R2) serves as the reading section 23 for the first photoelectric conversion section 21, and also serves as the second photoelectric conversion section 22.

A semiconductor region 46 that configures the reading section 23 is formed continuously on the semiconductor region 45(R1).

The semiconductor region 47(R3) is a separation region between the semiconductor region 45(R1) and the semiconductor region 43(R2). Electric charge that has been subjected to photoelectric conversion in this separation region is not read from the reading section 23. Therefore, this separation region functions as a no-effect region.

The semiconductor regions 41(G1) and 42(G2) of the first photoelectric conversion section 21, and the semiconductor region 45(R1) of the second photoelectric conversion section 22 are formed as N-type semiconductor regions in a P-type semiconductor region of the semiconductor substrate 11.

The semiconductor region 48—the semiconductor region 43(R2)—the semiconductor region 44, and the semiconductor region 46 are also formed as N-type semiconductor regions in the P-type semiconductor region of the semiconductor substrate 11. These semiconductor regions 48, 43, 44, and 46 are set to have impurity concentration that allows the semiconductor regions 48, 43, 44, and 46 to be depleted by a voltage for setting a pixel. Accordingly, photoelecconversion, reading of electric charge, etc. are allowed to be performed in these semiconductor regions 48, 43, 44, and 46.

The semiconductor region 47(R3) that is the separation region is a P-type semiconductor region.

The semiconductor region 41(G1) and the semiconductor region 42(G2) of the first photoelectric conversion section 21 and the semiconductor region 48—the semiconductor region 43(R2)—the semiconductor region 44 formed continuously thereon may have the same impurity concentration or may have different impurity concentrations. In a case where the semiconductor regions 41(G1) and 42(G2) and the semiconductor regions 48, 43(R2), and 44 have different impurity concentrations, the impurity concentrations are each set to allow all of the semiconductor regions 41(G1) and 42(G2) and the semiconductor regions 48, 43(R2), and 44 to be depleted by the voltage for setting a pixel.

The semiconductor region 45(R1) of the second photoelectric conversion section 22 and the semiconductor region 46 formed continuously thereon and configuring the reading section 23 may have the same impurity concentration or may have different impurity concentrations. In a case where the semiconductor region 45(R1) and the semiconductor region 46 have different impurity concentrations, the impurity concentrations are each set to allow the semiconductor region 45(R1) and the semiconductor region 46 to be both depleted by the voltage for setting a pixel.

As shown in the perspective view in FIG. 4B and in the planar view in FIG. 4C, the semiconductor region 45(R1) is formed to have an L-shaped planar pattern.

Further, the semiconductor region 41(G1) and the semiconductor region 42(G2) are formed to have a rectangular planar pattern together.

Further, the semiconductor regions 48, 43(R2), and 44 on the semiconductor region 42(G2) are formed on portions where the semiconductor region 45(R1) is not formed.

Moreover, as shown in the planar view in FIG. 4C, a transfer gate 13 that has a triangle planar pattern is provided on each of an upper-left portion of the semiconductor region 44 and an upper-right portion of the semiconductor region 46. Further, a floating diffusion 15 is provided below a tip portion of the transfer gate 13. The floating diffusion 15 serves as a charge accumulation section that accumulates electric charge read from the photoelectric conversion sections 21 and 22.

This floating diffusion 15 is provided common to the two transfer gates 13. Reading of the electric charge by one of the transfer gates 13 and reading of the electric charge by the other are performed sequentially.

It is to be noted that, in FIGS. 4A and 4B, illustration of the transfer gates 13 and the floating diffusion 15 is omitted.

Electric charge from the first photoelectric conversion section 21 read from the semiconductor region 44 in the reading section 23 is transferred to the floating diffusion 15 by the transfer gate 13 on the right in FIG. 4C.

Electric charge from the semiconductor region 45(R1) of the second photoelectric conversion section 22 read from the semiconductor region 46 in the reading section 23 is transferred to the floating diffusion 15 by the transfer gate 13 on the left in FIG. 4C.

In the present embodiment, as shown in FIG. 4C, the floating diffusion 15 is shared by the two transfer gates 13.

Therefore, the present embodiment has a circuit configuration in which the respective regions from the semiconductor region 41(G1) of the first photoelectric conversion section 21 to the semiconductor region 44 of the reading section 23 and the semiconductor region 45(R1) and the semiconductor region 46 of the second photoelectric conversion section 22 are arranged in one quadrangle of the pixel 2 in FIG. 1.

Moreover, the present embodiment has a circuit configuration in which the floating diffusion 15 and the transistors (such as the amplifier transistor, the selection transistor, and the reset transistor) are shared.

This circuit configuration is similar to a circuit configuration in a case where the floating diffusion and the transistors (such as the amplifier transistor, the selection transistor, and the reset transistor) are shared by two photoelectric conversion sections in a solid-state imaging device in which the photoelectric conversion sections are not laminated.

In the case where the above-mentioned sections are shared without laminating the photoelectric conversion sections, there is provided a structure in which the two photoelectric conversion sections sharing the respective sections mentioned above are arranged in the horizontal direction. However, the present embodiment has a vertically-laminated pixel structure in which the two photoelectric conversion sections sharing the respective sections mentioned above are laminated.

The light shielding structure 14 is configured to shield, from light, portions other than the reading section 23 and the photoelectric conversion sections 21 and 22. A portion, of the light shielding structure 14, corresponding to the reading section 23 is open.

Next, description will be provided of a method of processing a signal that is obtained based on the electric charge read by the reading section 23 in the solid-state imaging device in the present embodiment.

As shown in FIG. 5, first, a relationship between light amounts of R1 and R2 is determined in advance for light entering a depth region in the second photoelectric conversion section 22 as spectroscopic characteristics. For example, the relationship between the light amounts of R1 and R2 is determined for light having a wavelength of red R.

Specifically, a relationship represented by the following Expression (3) is determined.

$$R2=\alpha R1 \quad (3)$$

Concerning the semiconductor region 47(R3) that is a separation region, a relationship between light amounts of R1 and R3 is determined based on an area ratio between the semiconductor region 45(R1) and the semiconductor region 47(R3). Alternatively, the relationship between the light amounts of R1 and R3 is determined based on a difference between the amount of incident light of red R and the light amount of R1+R2 shown in FIG. 5 as a light reception amount of the semiconductor region 47(R3).

Specifically, a relationship represented by the following Expression (4) is determined.

$$R3=\beta R1 \quad (4)$$

A purpose of determining this R3 is to determine a photoelectric conversion amount in the no-effect region and to thereby allow the areas (the cross-sectional areas in the horizontal direction) of the first photoelectric conversion section 21 and the second photoelectric conversion section 22 to be equivalent. By allowing these areas to be equivalent, a difference in signal caused by the areas of the respective photoelectric conversion sections 21 and 22 is eliminated, and sensitivity becomes uniform.

It is to be noted that $\alpha$ and $\beta$ mentioned above are light amounts depending on area of photoelectric conversion, and are considered to be constant values. However, $\alpha$ and $\beta$ may be functions that vary depending on light amounts as α (light amount) and β (light amount).

Moreover, the values of α and β may be the same value in all of the pixels in the pixel section, or may be different values between the pixels depending on positions thereof in the pixel section.

The values of α and β may be the same value in all of the pixels in the pixel section if any particular problem is not caused thereby.

On the other hand, for example, when an influence is caused on the pixels in the peripheral portion of the pixel section based on a difference in distribution of incident angle of obliquely-entering light, the values of α and β may be different values between a central portion and the peripheral portion in the pixel section, or may vary in a step-wise manner from the central portion to the peripheral portion. It is to be noted that, when the influence is allowed to be reduced by a publicly-known method, for example, by shifting the position of the photoelectric conversion section in the pixel in the peripheral portion in the pixel section, the values of α and β may also be the same value by such a method.

A first signal obtained based on electric charge read from the semiconductor region 44 of the reading section 23 is G1+G2+R2.

A second signal obtained based on electric charge read from the semiconductor region 46 of the reading section 23 is only R1.

Further, finally, based on the first signal and the second signal, a signal of only green G is obtained as G=G1+G2=(G1+G2+R2)−R2=(G1+G2+R2)−αR1=first signal−α·second signal.

Also, based on the first signal, a signal of only green R is obtained as R=R1+R2+R3=R1(1+α+β)=second signal·(1+α+β).

The solid-state imaging device of the present embodiment is allowed to be manufactured by an existing publicly-known method.

The semiconductor regions having L-shaped cross-sections configured of the semiconductor regions 41, 42, 48, 43, and 44 and of the semiconductor regions 45 and 46 may be formed, for example, by performing ion injection from the front surface side of the semiconductor substrate and ion injection from the back surface side of the semiconductor substrate in combination.

Also, a semiconductor region extending longer in a height direction may be formed by repeatedly performing epitaxial growth of a semiconductor layer and ion injection to the epitaxial layer as disclosed in Patent Literature 1.

Here, FIGS. 13A to 13C each show, as a comparative example of the present technology, a configuration with a back-surface illumination type structure in which the reading section is shielded from light in a manner similar to that in an existing configuration in a configuration where two layers of photoelectric conversion sections are laminated.

FIG. 13A shows a cross-sectional view. FIG. 13B shows a perspective view. FIG. 13C shows a planar view (a top view).

FIG. 13A shows a cross-sectional view taken along a dashed line A-A'-A" in FIG. 13C.

As shown in FIG. 13A, a semiconductor region 203(G1) that serves as the first photoelectric conversion section is a region excluding a semiconductor region 204 that configures a reading section 210. Further, a semiconductor region 205(R1) that serves as the second photoelectric conversion section is a region excluding a semiconductor region 206 that configures the reading section 210.

A light shielding structure 202 has an opening 202A that is slightly narrower than the semiconductor region 203(G1) and the semiconductor region 205(R1) in order to shield the semiconductor regions 204 and 206 of the reading section 210 from light.

Transfer gates 207 on the semiconductor regions 204 and 206 of the reading section 210 and a floating diffusion 208 below the transfer gates 207 have the same configurations of the transfer gates 13 and the floating diffusion 15 in the second embodiment, respectively.

Planar patterns of the semiconductor regions 204 and 206 of the reading section 210, a planar pattern of the entire semiconductor region including the reading section and the photoelectric conversion sections, etc. have dimensions and shapes similar to those in the second embodiment.

As can be seen from comparison between this comparative example and the second embodiment, an area of the opening 202A of the light shielding structure 202 in the comparison example is about half of the area of the opening 14A of the light shielding structure 14 in the second embodiment. Further, an area of the semiconductor region used for photoelectric conversion is also largely reduced in the comparative example, compared to in the second embodiment.

Since the area of the opening 202A of the light shielding structure 202, the area of the semiconductor region used for photoelectric conversion, etc. are reduced as described above, the saturated signal amount Qs, sensitivity, etc. is decreased.

According to the above-described configuration of the solid-state imaging device of the present embodiment, the light shielding structure 14 shields, from light, the portions other than the photoelectric conversion sections 21 and 22 and the reading section 23. Further, the light shielding structure 14 has the opening 14A in a portion thereof corresponding to the reading section 23.

Accordingly, it is possible to allow light to enter the reading section 23 and to allow photoelectric conversion to be performed in the semiconductor region of the reading section 23.

Accordingly, it is possible to enlarge the opening 14A of the light shielding structure 14 to increase the area of the region in which photoelectric conversion is allowed to be performed. Therefore, it is possible to improve efficiency in pixel area utilization, and as a result, it is possible to improve saturated signal amount Qs, sensitivity, etc.

Moreover, it is possible to improve efficiency in pixel area utilization. Therefore, signal amount is increased and influence of noise becomes relatively small. Therefore, it is possible to improve S/N ratio.

Moreover, according to the configuration of the solid-state imaging device of the present embodiment, the semiconductor region 43(R2) serves as the reading section 23 for the first photoelectric conversion section 21 and also serves as the second photoelectric conversion section 22, and the electric charge that has been subjected to photoelectric conversion in the semiconductor region 43(R2) is allowed to be read.

Thus, it is possible to allow photoelectric conversion to be performed in the semiconductor region 43 configuring the reading section 23. Therefore, it is possible to dispose the reading section 23 above the first photoelectric conversion section 21 and to secure the reading section 23 with a sufficient area.

Accordingly, in the configuration where two layers of the photoelectric conversion sections 21 and 22 are laminated, it is possible to reduce the pixel size and to thereby achieve larger number of pixels, smaller size, etc. in the solid-state imaging device.

Moreover, the solid-state imaging device of the present embodiment has the back-surface illumination type structure. Therefore, compared to the front-surface illumination type structure in the first embodiment, the lines for the circuits from the incident surface to the photoelectric conversion sections 21 and 22 are eliminated, and heights from the incident surface to the photoelectric conversion sections 21 and 22 are reduced.

Accordingly, light blocked by the lines for the circuits, light not reaching the photoelectric conversion sections 21 and 22, etc. are reduced. Therefore, compared to the front-surface illumination type structure, it is possible to improve sensitivity of the solid-state imaging device.

Moreover, according to the method of processing a signal of the present embodiment described above, the light amount of the semiconductor region 47(R3) that is the separation region is also used for calculation. Therefore, it is possible to allow the first photoelectric conversion section 21 and the second photoelectric conversion section 22 to have the same area (the cross-sectional area in the horizontal direction).

Accordingly, a signal difference resulting from the difference in area between the two layers of the photoelectric conversion sections 21 and 22 is eliminated. Therefore, sensitivity in the two layers of the photoelectric conversion sections 21 and 22 is allowed to be uniform and the signal amounts are allowed to be the same. Accordingly, it is possible to simplify calculation.

It is to be noted that color mixture may be caused as a result of photoelectric conversion performed in a region between the semiconductor region 41(G1) of the first photoelectric conversion section 21 and the semiconductor region 45(R1) of the second photoelectric conversion section 22, i.e., at a depth other than those of the photoelectric conversion sections 21 and 22. This color mixture is of about the same degree as that in the existing vertically-laminated pixel structure, and the color mixture does not increase by adopting the configuration of the present embodiment.

In each of the embodiments described above, the photoelectric conversion section that performs photoelectric conversion on light of green G and the photoelectric conversion section that performs photoelectric conversion on light of red R are laminated.

In the present technology, lights that have been subjected to photoelectric conversion by the plurality of laminated photoelectric conversion sections is not limited to this combination of the wavelengths of light, and may be also applicable to light having any wavelength band including infrared light.

For example, the combination of wavelengths of light is not limited to G light and R light, and may be a combination of G light and B light.

Moreover, in the present technology, three or more layers of photoelectric conversion sections may be laminated.

An embodiment in a case where three layers of photoelectric conversion sections of red R, green G, and blue B are laminated is shown next.

3. Third Embodiment (Solid-State Imaging Device)

FIGS. 6, 7A, and 7B each show a schematic configuration diagram of a solid-state imaging device of a third embodiment.

FIG. 6 shows a cross-sectional view. FIG. 7A shows a perspective view. FIG. 7B shows a planar view (a top view).

The solid-state imaging device of the present embodiment has the back-surface illumination type structure as in the second embodiment.

The present embodiment has, in particular, a configuration in which three layers of photoelectric conversion sections in total are laminated by further adding another layer to the configuration in the second embodiment where the two layers of photoelectric conversion sections are laminated.

Specifically, a first photoelectric conversion section 24 on the back surface side of the semiconductor substrate 11 out of the three layers of photoelectric conversion sections 24, 25, and 26 performs photoelectric conversion on light of blue B that has a shortest wavelength. The second photoelectric conversion section 25 in the middle performs photoelectric conversion on light of green G. The third photoelectric conversion section 26 on the front surface side of the semiconductor substrate 11 performs photoelectric conversion on light of read R that has a longest wavelength.

The light shielding structure 14 is provided below the semiconductor substrate 11 so as to cover end edge portions of the semiconductor regions of the photoelectric conversion sections 24, 25, and 26 and the semiconductor regions therearound. An opening 14A of the light shielding structure 14 is located at a planar position that is in the inner side of end edges of the semiconductor regions of the photoelectric conversion sections.

The light shielding structure 14 may be configured of an existing publicly-known light shielding material.

As a configuration of the light shielding structure 14, for example, a metal layer, a layer containing black pigment, an anti-reflection film, a wiring layer also serving as a light shielding layer, a trench separation structure, etc. may be mentioned.

Moreover, although it is not illustrated, a micro lens that condenses incident light may be provided below (on the light incident side of) the light shielding structure 14 as necessary.

The first photoelectric conversion section 24 is configured of a semiconductor region 51(B1).

The second photoelectric conversion section 25 is configured of a semiconductor region 55(G1), a semiconductor region 52(G2), and a semiconductor region 60(G3).

The third photoelectric conversion section 26 is configured of a semiconductor region 58(R1), a semiconductor region 56(R2), a semiconductor region 62(R3), a semiconductor region 53(R4), and a semiconductor region 61(R5).

A semiconductor region 63, the semiconductor region 52(G2), a semiconductor region 64, the semiconductor region 53(R4), and a semiconductor region 54 are formed, in order from a lower layer, continuously on the semiconductor region 51(B1). It is to be noted that these semiconductor region 63, semiconductor region 52(G2), semiconductor region 64, semiconductor region 53(R4), and semiconductor region 54 are integrally-formed semiconductor regions that are sectioned based on depth and have the same impurity concentration.

Moreover, these semiconductor region 63, semiconductor region 52(G2), semiconductor region 64, semiconductor region 53(R4), and semiconductor region 54 configure a reading section 27 that reads electric charge that has been subjected to photoelectric conversion in the first photoelectric conversion section 24 (51).

Specifically, the semiconductor region 52(G2) serves as the reading section 27 for the first photoelectric conversion section 24, and also serve as the second photoelectric conversion section 25. The semiconductor region 53(R4) serves as both the reading section 27 for the first photoelectric conversion section 24, and also serve as the third photoelectric conversion section 26.

A semiconductor region 65, a semiconductor region 56(R2), and a semiconductor region 57 are formed, in order from a lower layer, continuously on the semiconductor region 55(G1). It is to be noted that these semiconductor region 65, semiconductor region 56(R2), and semiconductor region 57 are integrally-formed semiconductor regions that are sectioned based on depth and have the same impurity concentration.

Moreover, these semiconductor region 65, semiconductor region 56(R2), and semiconductor region 57 configure the reading section 27 that reads electric charge that has been subjected to photoelectric conversion in the semiconductor region 55(G1) of the second photoelectric conversion section 25.

Specifically, the semiconductor region 56(R2) serves as the reading section 27 for the semiconductor region 55(G1) of the second photoelectric conversion section 25, and also serves as the third photoelectric conversion section 26.

A semiconductor region 59 that configures the reading section 27 is formed continuously on the semiconductor region 58(R1).

The semiconductor region 60(G3) is a separation region between the semiconductor region 55(G1) and the semiconductor region 52(G2). The semiconductor region 62(R3) is a separation region between the semiconductor region 58(R1) and the semiconductor region 56(R2). The semiconductor region 61(R5) is a separation region between the semiconductor region 56(R2) and the semiconductor region 53(R3). Electric charges that have been subjected to photoelectric conversion in these separation regions are not read from the reading section 27. Therefore, these separation regions function as no-effect regions.

The semiconductor region 51 of the first photoelectric conversion section 24, the semiconductor region 55 of the second photoelectric conversion section 25, and the semiconductor region 58 of the third photoelectric conversion section 26 are each formed as an N-type semiconductor region in the P-type semiconductor region of the semiconductor substrate 11.

Also, the semiconductor region 63—the semiconductor region 52(G2)—the semiconductor region 64—the semiconductor region 53(R4)—the semiconductor region 54, the semiconductor region 65—the semiconductor region 56(R2)—the semiconductor region 57, and the semiconductor region 59 are each formed as an N-type semiconductor region in the P-type semiconductor region of the semiconductor substrate 11. These semiconductor regions are set to have impurity concentration that allows these semiconductor regions to be depleted by a voltage for setting a pixel. Accordingly, photoelectric conversion, reading of electric charge, etc. are allowed to be performed in these semiconductor regions.

The semiconductor region 60(G3), the semiconductor region 62(R3), and the semiconductor region 61(R5) that are separation regions are each a P-type semiconductor region.

The semiconductor region 51(B1) of the first photoelectric conversion section 24 and the semiconductor region 63—the semiconductor region 52(G2)—the semiconductor region 64—the semiconductor region 53(R4)—the semiconductor region 54 that are formed continuously thereon may have the same impurity concentration or may have different impurity concentrations.

The semiconductor region 55(G1) of the second photoelectric conversion section 25 and the semiconductor region 65—the semiconductor 56(R2)—the semiconductor region 57 formed continuously thereon may have the same impurity concentration or may have different impurity concentrations.

The semiconductor region 58(R1) of the third photoelectric conversion section 26 and the semiconductor region 59 that is continuously formed thereon and configures the reading section 27 may have the same impurity concentration or may have different impurity concentrations.

It is to be noted that, in a case where these combinations have different impurity concentrations, the impurity concentrations are each set to allow all of the above-mentioned semiconductor regions to be depleted by the voltage for setting a pixel.

As shown in the perspective view in FIG. 7A and in the planar view in FIG. 7B, the semiconductor region 58(R1) is formed to have a laterally-extending rectangular planar pattern.

The semiconductor region 55(G1) is formed to have an L-shaped planar pattern.

The semiconductor region 51(B1) is formed to have a rectangular planar pattern.

Further, the semiconductor regions 63, 52(G2), 64, 53(R3), and 54 on the semiconductor region 51(B1) are formed on portions where the semiconductor region 55(G1) is not formed.

The semiconductor regions 65, 56(R2), and 57 on the semiconductor region 55(G1) are formed on portions where the semiconductor region 58(R1) is not formed.

Moreover, as shown in the planar view in FIG. 7B, a transfer gate 13 that has a triangle planar pattern is provided on each of a lower-left portion of the semiconductor region 54, a lower-right portion of the semiconductor region 57, and an upper-right portion of the semiconductor region 59. Further, a floating diffusion 15 is provided below a tip portion of the transfer gate 13. The floating diffusion 15 serves as a charge accumulation section that accumulates electric charge read from the photoelectric conversion sections 24, 25, and 26.

This floating diffusion 15 is provided common to the three transfer gates 13. Reading operations of the electric charge by the respective transfer gates 13 are performed sequentially.

It is to be noted that, in FIGS. 6 and 7A, illustration of the transfer gates 13 and the floating diffusion 15 is omitted.

Electric charge from the first photoelectric conversion section 24 read from the semiconductor region 54 in the reading section 27 is transferred to the floating diffusion 15 by the transfer gate 13 on the upper-right in FIG. 7B.

Electric charge from the semiconductor region 55(G1) of the second photoelectric conversion section 25 read from the semiconductor region 57 in the reading section 27 is transferred to the floating diffusion 15 by the transfer gate 13 on the upper-left in FIG. 7B.

Electric charge from the semiconductor region 58(R1) of the third photoelectric conversion section 26 read from the semiconductor region 59 in the reading section 27 is transferred to the floating diffusion 15 by the transfer gate 13 on the lower-left in FIG. 7B.

In the present embodiment, as shown in FIG. 7B, the floating diffusion 15 is shared by the three transfer gates 13.

Therefore, the present embodiment has a circuit configuration in which the respective regions from the semiconductor region 51 to the semiconductor region 54, the respective regions from the semiconductor region 55 to the semiconductor region 57, and the semiconductor region 58 and the semiconductor region 59 are arranged in one quadrangle of the pixel 2 in FIG. 1.

Moreover, the present embodiment has a circuit configuration in which the floating diffusion 15 and the transistors (such as the amplifier transistor, the selection transistor, and the reset transistor) are shared.

The present embodiment has a vertically-laminated pixel structure in which the two photoelectric conversion sections sharing the respective sections mentioned above are laminated.

The light shielding structure 14 is configured to shield, from light, portions other than the reading section 27 and the photoelectric conversion sections 24, 25, and 26. A portion, of the light shielding structure 14, corresponding to the reading section 27 is open.

Next, description will be provided of a method of processing a signal that is obtained based on the electric charge read by the reading section 27 in the solid-state imaging device in the present embodiment.

As shown in FIG. 8, first, a relationship between light amounts of R1 and R2 and a relationship between light amounts of R1 and R4 are determined in advance for incident light as spectroscopic characteristics. For example, these relationships between light amounts are determined for light having a wavelength of red R.

Specifically, relationships represented by the following Expressions (5) and (6) are determined.

$$R2 = \alpha 1 R1 \quad (5)$$

$$R4 = \alpha 2 R1 \quad (6)$$

Concerning the semiconductor region 62(R3) and the semiconductor region 61(R5) that are separation regions, a relationship between light amounts of R1 and R3+R5 is determined based on an area ratio between the semiconductor region 58(R1) and the separation regions 62(R3) and 61(R5). Alternatively, the relationship between the light amounts of R1 and R3+R5 is determined based on a difference between the amount of incident light of red R and the light amount of R1+R2+R4 shown in FIG. 8 as a light amount of R3+R5.

Specifically, a relationship represented by the following Expression (7) is determined.

$$R3 + R5 \beta R1 \quad (7)$$

Next, a relationship between light amounts of G1 and G2 is determined for light having a wavelength of green G.

Specifically, a relationship represented by the following Expression (8) is determined.

$$G2 = \gamma G1 \quad (8)$$

Concerning the semiconductor region 60(G3) that is a separation region, the relationship between the light amounts of G1 and G3 is determined based on an area ratio between the semiconductor region 55(G1) and the semiconductor region 60(G3). Alternatively, the relationship between the light amounts of G1 and G3 is determined based on a difference between the amount of incident light of green G and the light amount of G1+G2 shown in FIG. 8 as a light reception amount of the semiconductor region 60(G3).

Specifically, a relationship represented by the following Expression (9) is determined.

$$G3 = \eta G1 \quad (9)$$

$\alpha 1$, $\alpha 2$, $\beta$, $\gamma$, and $\eta$ may be constant values or may be functions that vary based on light amounts.

Moreover, the values of $\alpha 1$, $\alpha 2$, $\beta$, $\gamma$, and $\eta$ each may be the same value in all of the pixels in the pixel section, or may be different values between the pixels depending on positions thereof in the pixel section.

The values of $\alpha 1$, $\alpha 2$, $\beta$, $\gamma$, and $\eta$ each may be the same value in all of the pixels in the pixel section if any particular problem is not caused thereby.

On the other hand, for example, when an influence is caused on the pixels in the peripheral portion of the pixel section based on a difference in distribution of incident angle of obliquely-entering light, the values of $\alpha 1$, $\alpha 2$, $\beta$, $\gamma$, and $\eta$ each may be different values between a central portion and the peripheral portion in the pixel section, or may vary in a step-wise manner from the central portion to the peripheral portion. It is to be noted that, when the influence is allowed to be reduced by a publicly-known method, for example, by shifting the position of the photoelectric conversion section in the pixel in the peripheral portion in the pixel section, the values of $\alpha 1$, $\alpha 2$, $\beta$, $\gamma$, and $\eta$ each may also be the same value by such a method.

A first signal obtained based on electric charge read from the semiconductor region 54, a second signal obtained based on electric charge read from the semiconductor region 57, and a third signal obtained based on electric charge read from the semiconductor region 59 are as follows.

The first signal = $B1 + G2 + R4 = B1 + \gamma G1 + \alpha 2 R1$

The second signal = $G1 + R2 = G1 + \alpha 1 R1$

The third signal = $R1$

Further, finally, based on these signals, a signal of blue B, a signal of green G, and a signal of red R are obtained as follows.

The signal of blue $B = B1$ = the first signal $- G2 - R4$ = the first signal $- (\gamma G1 + \alpha 2 R1)$ = the first signal $- (\gamma(\text{the second signal} - \alpha 1 R1) + \alpha 2 R1)$ = the first signal $- \gamma$ (the second signal) $+ (\gamma \alpha 1 - \alpha 2)$ (the third signal)

The signal of green $G = G1 + G2 + G3 = G1 + \gamma G1 + \eta G1 = (1 + \gamma + \eta)$ (the second signal $- \alpha 1$ (the third signal))

The signal of red $R = R1 + R2 + R3 + R4 + R5 = (R1 + R2 + R4) + (R3 + R5) = (R1 + \alpha 1 R1 + \alpha 2 R1) + \beta R1 = (1 + \alpha 1 + \alpha 2 + \beta)$ (the third signal)

The solid-state imaging device of the present embodiment is allowed to be manufactured by an existing publicly-known method.

The semiconductor region having an L-shaped cross-section configured of the semiconductor regions 51, 63, 52, 64, 53, 54, etc. may be formed, for example, by performing ion injection from the front surface side of the semiconductor substrate and ion injection from the back surface side of the semiconductor substrate in combination.

Also, a semiconductor region extending longer in a height direction may be formed by repeatedly performing epitaxial growth of a semiconductor layer and ion injection to the epitaxial layer as disclosed in Patent Literature 1.

According to the above-described configuration of the solid-state imaging device of the present embodiment, the light shielding structure 14 shields, from light, the portions other than the photoelectric conversion sections 24, 25, and 26, and the reading section 27. Further, the light shielding structure 14 has the opening 14A in a portion corresponding to the reading section 27.

Accordingly, it is possible to allow photoelectric conversion to be performed in the semiconductor region of the reading section 27 as in the second embodiment. Therefore, it is possible to improve efficiency in pixel area utilization, and as a result, it is possible to improve saturated signal amount Qs, sensitivity, etc. Moreover, signal amount is increased and influence of noise becomes relatively small. Therefore, it is possible to improve S/N ratio.

Moreover, according to the configuration of the solid-state imaging device of the present embodiment, the semiconductor region 52(G2) serves as the reading section 27 for the first photoelectric conversion section 24 and also serves as the second photoelectric conversion section 25, and the electric charge that has been subjected to photoelectric conversion in the semiconductor region 52(G2) is allowed to be read. The semiconductor region 53(R4) serves as the reading section 27 for the first photoelectric conversion section 24 and also serves as the third photoelectric conversion section 26, and the electric charge that has been subjected to photoelectric conversion in the semiconductor region 53(R4) is allowed to be read. The semiconductor region 56(R2) serves as the reading section 27 for the second photoelectric conversion section 25 and also serves as the third photoelectric conversion section 26, and the electric charge that has been subjected to photoelectric conversion in the semiconductor region 56(R2) is allowed to be read.

Thus, it is possible to allow photoelectric conversion to be performed in the semiconductor regions 52, 53, and 56 configuring the reading section 27. Therefore, it is possible to dispose the reading section 27 above the first photoelectric conversion section 24 and to secure the reading section 27 with a sufficient area.

Accordingly, in the configuration where three layers of the photoelectric conversion sections 24, 25, and 26 are laminated, it is possible to reduce the pixel size and to thereby achieve larger number of pixels, smaller size, etc. in the solid-state imaging device.

Moreover, the solid-state imaging device of the present embodiment has the back-surface illumination type structure. Therefore, compared to the front-surface illumination type structure, it is possible to improve sensitivity of the solid-state imaging device.

Moreover, according to the method of processing a signal of the present embodiment described above, the light amount of the semiconductor regions 60(G3), 61(R5), and 62(R3) that are the separation regions is also used for calculation. Therefore, it is possible to allow the three layers of the photoelectric conversion sections 24, 25, and 26 to have the same area.

Accordingly, a signal difference resulting from the difference in area between the three layers of the photoelectric conversion sections 24, 25, and 26 is eliminated. Therefore, sensitivity in the three layers of the photoelectric conversion sections 24, 25, and 26 is allowed to be uniform and the signal amounts are allowed to be the same. Accordingly, it is possible to simplify calculation.

It is to be noted that color mixture may be caused as a result of photoelectric conversion performed in a region between the semiconductor region 51(B1) of the first photoelectric conversion section 24 and the semiconductor region 55(G1) of the second photoelectric conversion section 25, or the like, i.e., at a depth other than those of the photoelectric conversion sections 24, 25, and 26. This color mixture is of about the same degree as that in the existing vertically-laminated pixel structure, and the color mixture does not increase by adopting the configuration of the present embodiment.

4. Fourth Embodiment (Solid-State Imaging Device)

FIGS. 9A to 9C each show a schematic configuration diagram of a solid-state imaging device of a fourth embodiment.

FIG. 9A shows a cross-sectional view. FIG. 9B shows a perspective view. FIG. 9C shows a planar view (a top view).

The solid-state imaging device of the present embodiment has the back-surface illumination type structure as in the second embodiment.

The present embodiment has, in particular, a configuration in which the planar pattern of the photoelectric conversion sections is changed and the area of the photoelectric conversion sections is minimized in the configuration in the second embodiment where the two layers of photoelectric conversion sections are laminated.

Specifically, the semiconductor region 41(G1) of the first photoelectric conversion section 21 is reduced from that in the second embodiment shown in FIGS. 4A to 4C, and is provided with a rectangular planar pattern that is expanded only slightly from the semiconductor region 46 and the semiconductor region 44 of the reading section 23.

Moreover, the semiconductor region 45(R1) of the second photoelectric conversion section 22 is reduced from that in the second embodiment shown in FIGS. 4A to 4C, and is provided with a planar pattern same as that of the semiconductor region 46 of the reading section 23 on the semiconductor region 45(R1).

Thus, the areas of the semiconductor regions of the photoelectric conversion sections 21 and 22 are reduced to half of those in the second embodiment. In accordance with the reduction in the semiconductor regions of the photoelectric conversion sections 21 and 22, the opening 14A of the light shielding structure 14 is also reduced in size.

Moreover, the transfer gate 13 and the floating diffusion 15 are disposed on the upper side in the drawing with respect to the semiconductor regions 44 and 46 of the reading section 23 in FIG. 4C. However, as shown in FIG. 9C, the transfer gate 13 and the floating diffusion 15 are disposed on the lower side of the drawing with respect to the semiconductor regions 44 and 46 of the reading section 23.

Other configurations are similar to those in the second embodiment, and therefore, will not be described again.

Moreover, a method of processing a signal obtained by electric charge read from the reading section 23 is allowed to be performed as in the second embodiment.

According to the above-described present embodiment, as in the second embodiment, it is possible to improve efficiency in pixel area utilization, and as a result, it is possible to improve saturated signal amount Qs, sensitivity, etc. Moreover, signal amount is increased and influence of noise becomes relatively small. Therefore, it is possible to improve S/N ratio.

Moreover, it is possible to allow photoelectric conversion to be performed in the semiconductor region 43 configuring the reading section 23. Therefore, it is possible to dispose the reading section 23 above the first photoelectric conversion section 21 and to secure the reading section 23 with a sufficient area.

Accordingly, in the configuration where two layers of the photoelectric conversion sections 21 and 22 are laminated, it is possible to reduce the pixel size and to thereby achieve larger number of pixels, smaller size, etc. in the solid-state imaging device.

In particular, in the present embodiment, the areas of the semiconductor regions of the photoelectric conversion sections 21 and 22 are reduced to almost half of those in the second embodiment. Therefore, it is possible to further reduce the pixel size and to thereby achieve further larger number of pixels, further smaller size, etc. in the solid-state imaging device.

Moreover, the solid-state imaging device of the present embodiment has the back-surface illumination type structure. Therefore, compared to the front-surface illumination type structure, it is possible to improve sensitivity of the solid-state imaging device.

5. Fifth Embodiment (Solid-State Imaging Device)

FIGS. 10A to 10C each show a schematic configuration diagram of a solid-state imaging device of a fifth embodiment.

FIG. 10A shows a cross-sectional view. FIG. 10B shows a perspective view. FIG. 10C shows a planar view (a top view).

FIG. 10A is a cross-sectional view taken along a dashed line A-A'-A" in FIG. 10C.

The solid-state imaging device of the present embodiment has the back-surface illumination type structure as with the second embodiment.

In particular, the present embodiment has a configuration in which a voltage is applied with the use of the reading gate, and thereby, the depletion layer is formed to perform a reading operation, compared to the configuration in the second embodiment in which the depletion layer is formed with the use of an impurity to perform a reading operation.

Specifically, the planar pattern of each of the semiconductor regions 44 and 46 of the reading section 23 is changed to a trapezoidal shape obtained by removing a triangle on the corner from a rectangle, and the reading gates 16 are provided above these semiconductor regions 44 and 46. The reading gate 16 is formed to have a trapezoidal planar pattern similar to that of the semiconductor regions 44 and 46.

Moreover, the floating diffusion 15 having a triangle planar pattern is formed next to each of the semiconductor regions 44 and 46 of the reading section 23 separately.

The reading gate 16 may be formed of a metal layer, a polycrystalline silicon layer, etc.

By turning on the reading gate 16 and applying a positively-biased voltage to the semiconductor substrate 11, the depletion layer expands in a semiconductor region below the reading gate 16. Therefore, electric charge that has been subjected to photoelectric conversion is allowed to be stored in the semiconductor region below the reading gate 16.

By turning off the reading gate 16 and stopping application of the voltage, the electric charge that has been subjected to photoelectric conversion in the semiconductor region below the reading gate 16 is allowed to be read to the front surface 11A side of the semiconductor substrate 11. The read electric charge is transferred to the floating diffusion 15.

As shown in FIG. 10C, the floating diffusions 15 are provided separately for the respective two reading gates 16 in the present embodiment.

Therefore, as in the first embodiment, a circuit including one of the floating diffusions 15 and a circuit including the other of the floating diffusions 15 each configure one pixel 2 in the circuit configuration diagram in FIG. 1.

As in the second embodiment, the light shielding structure 14 is configured to shield, from light, portions other than the reading section 23 and the photoelectric conversion sections 21 and 22. A portion, of the light shielding structure 14, corresponding to the reading section 23 is open.

Other configurations are similar to those in the second embodiment, and therefore, will not be described again.

Moreover, a method of a signal obtained by electric charge read from the reading section 23 is allowed to be performed in a manner similar to that in the second embodiment.

According to the above-described present embodiment, as in the second embodiment, it is possible to improve efficiency in pixel area utilization, and as a result, it is possible to improve saturated signal amount Qs, sensitivity, etc. Moreover, signal amount is increased and influence of noise becomes relatively small. Therefore, it is possible to improve S/N ratio.

Moreover, it is possible to allow photoelectric conversion to be performed in the semiconductor region 43 configuring the reading section 23. Therefore, it is possible to dispose the reading section 23 above the first photoelectric conversion section 21 and to secure the reading section 23 with a sufficient area. In the present embodiment, the area of the semiconductor regions 44 and 46 of the reading section 23 is smaller than that in the second embodiment. However, it is possible to secure the reading section 23 with a sufficient area.

Therefore, it is possible to reduce the pixel size and to thereby achieve larger number of pixels, smaller size, etc. in the solid-state imaging device in the configuration in which the two layers of the photoelectric conversion sections 21 and 22 are laminated.

Moreover, the solid-state imaging device of the present embodiment has the back-surface illumination type structure. Therefore, compared to the front-surface illumination type structure, it is possible to improve sensitivity of the solid-state imaging device.

6. Sixth Embodiment (Solid-State Imaging Device)

FIG. 11 illustrates a schematic configuration diagram (a cross-sectional view of main part) of a solid-state imaging device of a sixth embodiment.

The solid-state imaging device of the present embodiment has the back-surface illumination type structure as with the second embodiment.

In particular, the present embodiment has a configuration in which the first photoelectric conversion section on the light incident side is changed to an organic photoelectric conversion layer provided on the back surface side (on the light incident surface side) of the semiconductor substrate, compared to the configuration of the second embodiment in which the two layers of the photoelectric conversion sections are laminated inside the semiconductor substrate.

As shown in FIG. 11, the present embodiment includes, as the first photoelectric conversion section, one photoelectric conversion section (organic photoelectric conversion section), on the back surface 11B side of the semiconductor substrate 11, that is configured of an organic photoelectric conversion layer that receives and detects light of green G.

This photoelectric conversion section (organic photoelectric conversion section) is configured by connecting an organic photoelectric conversion layer 71 made of an organic photoelectric conversion material to an electrode 72 on the semiconductor substrate 11 side.

The organic photoelectric conversion layer 71 absorbs light of green G and performs photoelectric conversion thereon. Also, the organic photoelectric conversion layer 71 has a function of a color filter that transmits light of blue B and red R.

A transparent conductive material such as indium-tin oxide (ITO) and indium-zinc oxide may be used for the electrode 72.

It is to be noted that the electrode made of the transparent conductive material may be further provided on the light incident side of the organic photoelectric conversion layer 71 to provide a configuration in which the two electrodes sandwich the organic photoelectric conversion layer 71.

As the organic photoelectric conversion material, of the organic photoelectric conversion layer 71, that performs photoelectric conversion on light of green G, for example, an organic photoelectric conversion material including rhodamine-based pigment, merocyanine-based pigment, quinacridone, etc.

The electrode 72 of the organic photoelectric conversion section is connected, via a conductive plug layer 73, to an $N^+$ semiconductor region 74 formed near the back surface 11B of the semiconductor substrate 11.

Moreover, a semiconductor region 75 that is connected to the $N^+$ semiconductor region 74 is formed inside the semiconductor substrate 11.

This semiconductor region 75 is formed integrally with the semiconductor regions 43(R2) and 44 thereon and has impurity concentration same as that of the semiconductor regions 43(R2) and 44.

It is to be noted that configurations of the semiconductor regions 45(R1), 43(R2), and 47(R3) of the second photoelectric conversion section 22 and configurations thereon are similar to those in the second embodiment.

The semiconductor region 75, the semiconductor region 43(R2), and the semiconductor region 44 configure the reading section 23 that reads electric charge that has been subjected to photoelectric conversion in the first photoelectric conversion section (organic photoelectric conversion section).

Specifically, the semiconductor region 43(R2) serves as the reading section 23 for the first photoelectric conversion section (organic photoelectric conversion section), and also serves as the second photoelectric conversion section 22.

The electric charge that has been subjected to photoelectric conversion in the organic photoelectric conversion layer 71 passes through the electrode 72 and the plug layer 72, and passes through the $N^+$ semiconductor region 74, and enters the semiconductor regions 75, 43(R2), and 44 inside the semiconductor substrate 11.

Moreover, the electric charge is transferred, by the transfer gate, from the semiconductor region 44 of the reading section 23 to a floating diffusion serving as a charge accumulation section.

The organic photoelectric conversion layer 71 of the organic photoelectric conversion section is formed in a range larger than the opening of the light shielding structure 14, and is formed to have an area larger than that of the second photoelectric conversion section 22.

Therefore, it is possible to improve sensitivity of the organic photoelectric conversion layer 71 to the light of green G compared to a case where the organic photoelectric conversion layer 71 is the same size as the opening of the light shielding structure 14, the second photoelectric conversion section 22, or the like.

According to the above-described present embodiment, as in the second embodiment, it is possible to improve efficiency in pixel area utilization, and as a result, it is possible to improve saturated signal amount Qs, sensitivity, etc.

Moreover, signal amount is increased and influence of noise becomes relatively small. Therefore, it is possible to improve S/N ratio.

Moreover, it is possible to allow photoelectric conversion to be performed in the semiconductor region 43 configuring the reading section 23. Therefore, it is possible to dispose the reading section 23 above the organic photoelectric conversion section of the first photoelectric conversion section and to secure the reading section 23 with a sufficient area.

Therefore, it is possible to reduce the pixel size and to thereby achieve larger number of pixels, smaller size, etc. in the configuration in which the two layers of the photoelectric conversion sections are laminated.

Moreover, the solid-state imaging device of the present embodiment has the back-surface illumination type structure. Therefore, compared to the front-surface illumination type structure, it is possible to improve sensitivity of the solid-state imaging device.

In the above-described embodiment, as a combination of colors, the organic photoelectric conversion section is set to green G and the first photoelectric conversion section is set to red R. However, other combination of colors may be adopted.

For example, the organic photoelectric conversion section may be set to red R or blue B, and the photoelectric conversion sections inside the semiconductor substrate may be set to other corresponding colors.

As an organic photoelectric conversion material that performs photoelectric conversion on light of red R, an organic photoelectric conversion material including phthalocyanine-based pigment may be used.

As an organic photoelectric conversion material that performs photoelectric conversion on light of blue B, an organic photoelectric conversion material including coumarin-based pigment, merocyanine-based pigment, etc. may be used.

Moreover, the above-described embodiment has a configuration in which the first photoelectric conversion section configured of the organic photoelectric conversion section and the second photoelectric conversion section 22 in the semiconductor substrate 11 are laminated. However, a configuration in which the organic photoelectric conversion section and two photoelectric conversion sections in the semiconductor substrate, that is, three photoelectric conversion sections in total are laminated may be also adopted.

In the present technology, the number of the laminated photoelectric conversion sections is not limited to two or three, and may be four or more.

Moreover, the number of frequency bands that are subjected to photoelectric conversion in one photoelectric conversion section is not limited to one. For example, there may be provided a photoelectric conversion section that performs photoelectric conversion on two or more frequency bands out of light of R, G, and B.

Moreover, the present technology is not limited to a configuration in which a plurality of photoelectric conversion sections are formed in one semiconductor substrate. There may be adopted a configuration in which a plurality of thin-film semiconductor layers each provided with a photoelectric conversion section are laminated.

In the above-described third to sixth embodiments, a case of applying to the back-surface illumination type structure as that in the second embodiment is described.

In the present technology, any of the configurations of the third to sixth embodiments is applicable to a front-surface illumination type structure as that in the first embodiment. When applying to the front-surface illumination type structure, the combination of colors subjected to photoelectric conversion in the respective photoelectric conversion section is vertically reversed from those in the case of applying the present technology to the back-surface illumination type structure.

In each of the embodiments described above, the semiconductor region of the photoelectric conversion section and the semiconductor region of the reading section are each formed as the N-type semiconductor region in the P-type semiconductor region in the semiconductor substrate 11.

In the present technology, the conductivity types may be reversed from those in each of the embodiments described above, and thereby achieve a configuration in which the semiconductor region of the photoelectric conversion section and the semiconductor region of the reading section are each formed as a P-type semiconductor region in an N-type semiconductor region in the semiconductor substrate.

The method of processing a signal described in the first to third embodiments is allowed to be generalized as follows so that the method is applicable independently of the wavelength bands (colors) of light subjected to photoelectric conversion in the respective photoelectric conversion sections, the number of layers of the photoelectric conversion sections, and which of the front-surface illumination type structure and the back-surface illumination type structure is used. It is to be noted that "back surface side" refers to an opposite side from the circuit formation surface of the semiconductor substrate, and "front surface side" refers to the circuit formation surface side of the semiconductor substrate.

A signal of a photoelectric conversion section on a most back surface side: Subtract a signal based on electric charge subjected to photoelectric conversion in a semiconductor region, out of semiconductor regions of a reading section, that also serves as other photoelectric conversion section, from a signal based on electric charge read from the reading section connected to the relevant photoelectric conversion section.

A signal of a photoelectric conversion section in the middle (in a case of three or more layers): Determine a signal based on electric charge read in the reading section connected to a semiconductor region, in the photoelectric conversion section, that does not serve as the reading section for other photoelectric conversion section. Subsequently, subtract therefrom a signal based on electric charge subjected to photoelectric conversion in a semiconductor region, out of the semiconductor regions of the reading section, that also serves as other photoelectric conversion section on the front surface side compared to the relevant photoelectric conversion section. Multiply thus-obtained signal by a coefficient of an area ratio or a light amount ratio, and thereby, increase the semiconductor region that also serves as the reading section for the photoelectric conversion section on the back surface side compared to the separation region, the relevant photoelectric conversion section, etc.

A signal of a photoelectric conversion on a most front surface side: Determine a signal based on electric charge read from a reading section, in the relevant photoelectric conversion section, that does not serve as the reading section for other photoelectric conversion section and is connected to a semiconductor region. Further, multiply this signal by a coefficient of an area ratio or a light amount ratio, and thereby, increase the semiconductor region that also serves as the reading section for the separation region, other photoelectric conversion section, etc.

The solid-state imaging device according to the present technology is applicable to various electronic apparatuses, for example, a camera system such as digital camera and a video camcorder, a mobile phone having an imaging function, other apparatuses having an imaging function, and the like.

7. Seventh Embodiment (Electronic Apparatus)

FIG. 12 shows a schematic configuration diagram (a block diagram) of an electronic apparatus of a seventh embodiment.

The present embodiment shows a case where the present technology is applied to an electronic apparatus that includes a camera capable of shooting a still image or a moving image.

As shown in FIG. 12, this electronic apparatus 121 includes a solid-state imaging device 122, an optical system 123, a shutter device 124, a drive circuit 125, and a signal processing circuit 126.

The optical system 123 is configured of, for example, an optical lens or the like. The optical system 123 forms an image of image light (incident light) from a subject on a pixel section of the solid-state imaging device 122. Accordingly, signal electric charge is accumulated in the solid-state imaging device 122 for a certain period. The optical system 123 may be configured of an optical lens system configured of a plurality of optical lenses.

As the solid-state imaging device 122, the solid-state imaging device according to the present technology such as the solid-state imaging device in each of the above-described embodiment is used.

The shutter device 124 controls periods of light illumination and light shielding with respect to the solid-state imaging device 122.

The drive circuit 125 supplies a drive signal that controls a transfer operation of the solid-state imaging device 122 and a shutter operation of the shutter device 124. A signal transfer operation in the solid-state imaging device 122 is performed based on the drive signal (a timing signal) supplied from the drive circuit 125.

The signal processing circuit 126 performs various signal processings. An image signal subjected to the signal processing is stored in a storage medium such as a memory, or is outputted to a monitor.

According to the configuration of the electronic apparatus 121 of the present embodiment described above, the solid-state imaging device according to the present technology such as the solid-state imaging device in each of the above-described embodiments is used as the solid-state imaging device 122. Therefore, it is possible to improve saturated signal amount Qs, sensitivity, etc. of the solid-state imaging device 122, to improve S/N ratio, etc. Also, it is possible to reduce the pixel size of the solid-state imaging device 122 and to thereby achieve larger number of pixels, smaller size, etc. in the solid-state imaging device 122.

In the present technology, the configuration of the electronic apparatus is not limited to the configuration shown in FIG. 12, and may be a configuration other than that shown in FIG. 12 as long as the configuration uses the solid-state imaging device according to the present technology.

It is to be noted to achieve the following configurations from the present disclosure.

(1) A solid-state imaging device including:
a plurality of laminated photoelectric conversion sections;
a reading section configured of a semiconductor region formed inside a semiconductor substrate and reading electric charge that has been subjected to photoelectric conversion in the photoelectric conversion sections;

a charge accumulation section accumulating the electric charge read by the reading section; and a light shielding structure shielding, from light, a portion other than the reading section and the photoelectric conversion sections.

(2) The solid-state imaging device according to (1), wherein the light shielding structure has an opening in a portion thereof corresponding to the reading section.

(3) The solid-state imaging device according to (1) or (2), wherein the semiconductor region of the reading section is depleted and thereby has a photoelectric conversion function.

(4) The solid-state imaging device according to (3), wherein the semiconductor region of the reading section is formed to have impurity concentration that allows the semiconductor region of the reading section to be depleted by a given voltage, and thereby has the photoelectric conversion function.

(5) The solid-state imaging device according to (3), further including a reading gate formed on the reading section and allowing a voltage to be applied to deplete the semiconductor region of the reading section.

(6) The solid-state imaging device according to (3), wherein part of the semiconductor region configuring the reading section serves as the reading section for one of the plurality of photoelectric conversion sections and also serves as another photoelectric conversion section.

(7) The solid-state imaging device according to any one of (1) to (6), wherein the plurality of photoelectric conversion sections are all formed inside the semiconductor substrate.

(8) The solid-state imaging device according to any one of (1) to (6), wherein the plurality of photoelectric conversion sections include a photoelectric conversion section formed inside the semiconductor substrate and an organic photoelectric conversion section disposed on a light incident side of the semiconductor substrate and configured of an organic photoelectric conversion layer.

(9) The solid-state imaging device according to any one of (1) to (8), wherein the solid-state imaging device has a back-surface illumination type structure that allows light to enter from an opposite side from a circuit formation surface of the semiconductor substrate.

(10) An electronic apparatus including:
an optical system;
the solid-state imaging device according to any one of (1) to (9); and
a signal processing circuit processing an output signal from the solid-state imaging device.

The present technology is not limited to the above-described embodiments, and is allowed to have various other configurations in a scope not departing from the gist of the present technology.

This application claims the priority of Japanese Patent Application JP 2012-058749 filed Mar. 15, 2012, the entire contents of each which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device, comprising:
a semiconductor substrate including:
a plurality of photoelectric conversion sections in the semiconductor substrate, wherein each of the plurality of photoelectric conversion sections comprises a first semiconductor region;
a reading section that comprises a second semiconductor region provided inside the semiconductor substrate, wherein the reading section is configured to read a first electric charge that has been subjected to photoelectric conversion in the plurality of photoelectric conversion sections,
wherein the second semiconductor region of the reading section is on the first semiconductor region of a first photoelectric conversion section of the plurality of photoelectric conversion sections,
wherein a first impurity concentration of the first semiconductor region of the first photoelectric conversion section of the plurality of photoelectric conversion sections is different from a second impurity concentration of the second semiconductor region of the reading section;
a charge accumulation section configured to accumulate the first electric charge read by the reading section; and
a light shielding structure on a first portion of the semiconductor substrate, other than the reading section and the plurality of photoelectric conversion sections, wherein the light shielding structure is configured to shield the first portion of the semiconductor substrate from light.

2. The solid-state imaging device according to claim 1, wherein the light shielding structure is further configured to have an opening in a second portion, of the light shielding structure, thereof corresponding to the reading section.

3. The solid-state imaging device according to claim 1, wherein at least a third portion of the second semiconductor region of the reading section is configured to be depleted and thereby has a photoelectric conversion function.

4. The solid-state imaging device according to claim 3, wherein the second semiconductor region of the reading section is configured to have the second impurity concentration that allows the second semiconductor region of the reading section to be depleted by a voltage, and thereby has the photoelectric conversion function.

5. The solid-state imaging device according to claim 3, further comprising a reading gate formed on the reading section and allowing a voltage to be applied to deplete the semiconductor region of the reading section.

6. The solid-state imaging device according to claim 3, wherein the third portion of the second semiconductor region of the reading section is configured to serve as the reading section for a second photoelectric conversion section of the plurality of photoelectric conversion sections and further serve the photoelectric conversion function for the first photoelectric conversion section of the plurality of photoelectric conversion sections.

7. The solid-state imaging device according to claim 1, wherein the plurality of photoelectric conversion sections include a photoelectric conversion section formed inside the semiconductor substrate and an organic photoelectric conversion section disposed on a light incident side of the semiconductor substrate and configured of an organic photoelectric conversion layer.

8. The solid-state imaging device according to claim 1, wherein the solid-state imaging device has a back-surface illumination type structure that is configured to allow the light to enter from a first side of the semiconductor substrate that is opposite to a second side of the semiconductor substrate with the plurality of photoelectric conversion sections.

9. An electronic apparatus, comprising:
an optical system;
a solid-state imaging device including:
- a semiconductor substrate including:
  - a plurality of photoelectric conversion sections in the semiconductor substrate, wherein each of the plurality of photoelectric conversion sections comprises a first semiconductor region,
  - a reading section that comprises a second semiconductor region inside the semiconductor substrate, wherein the reading section is configured to read electric charge that has been subjected to photoelectric conversion in the plurality of photoelectric conversion sections,
    - wherein the second semiconductor region of the reading section is on the first semiconductor region of a photoelectric conversion section of the plurality of photoelectric conversion sections,
    - wherein a first impurity concentration of the first semiconductor region of the photoelectric conversion section of the plurality of photoelectric conversion sections is different from a second impurity concentration of the second semiconductor region of the reading section,
  - a charge accumulation section configured to accumulate the electric charge read by the reading section, and
  - a light shielding structure on a portion of the semiconductor substrate, other than the reading section and the plurality of photoelectric conversion sections, wherein the light shielding structure is configured to shield the portion of the semiconductor substrate from light; and
- a signal processing circuit configured to process an output signal from the solid-state imaging device.

10. The solid-state imaging device according to claim 1, wherein the plurality of photoelectric conversion sections are laminated in a depth direction of the semiconductor substrate.

11. The solid-state imaging device according to claim 1, wherein the first photoelectric conversion section of the plurality of photoelectric conversion sections comprises a third semiconductor region, wherein the reading section is unable to read a second electric charge that has been subjected to the photoelectric conversion in the third semiconductor region.

12. The solid-state imaging device according to claim 11, wherein the third semiconductor region is a P-type semiconductor region.

* * * * *